(12) United States Patent
Zeng et al.

(10) Patent No.: US 11,573,259 B1
(45) Date of Patent: Feb. 7, 2023

(54) QUANTUM ERROR-CORRECTION IN MICROWAVE INTEGRATED QUANTUM CIRCUITS

(71) Applicant: Rigetti & Co, LLC, Berkeley, CA (US)

(72) Inventors: William J. Zeng, Berkeley, CA (US); Eyob A. Sete, Walnut Creek, CA (US); Chad Tyler Rigetti, Walnut Creek, CA (US)

(73) Assignee: Rigetti & Co, LLC, Berkeley, CA (US)

( * ) Notice: Subject to any disclaimer, the term of this patent is extended or adjusted under 35 U.S.C. 154(b) by 0 days.

(21) Appl. No.: 17/695,980

(22) Filed: Mar. 16, 2022

Related U.S. Application Data

(60) Division of application No. 17/066,187, filed on Oct. 8, 2020, now Pat. No. 11,307,242, which is a continuation of application No. 16/424,901, filed on May 29, 2019, now Pat. No. 10,852,346, which is a division of application No. 15/380,822, filed on Dec. 15, 2016, now Pat. No. 10,352,992.

(60) Provisional application No. 62/277,256, filed on Jan. 11, 2016.

(51) Int. Cl.
*G01R 31/00* (2006.01)
*G01R 31/28* (2006.01)
*G06N 10/00* (2022.01)

(52) U.S. Cl.
CPC ......... *G01R 31/2851* (2013.01); *G06N 10/00* (2019.01)

(58) Field of Classification Search
None
See application file for complete search history.

(56) References Cited

U.S. PATENT DOCUMENTS

| 6,900,456 | B2 | 5/2005 | Blais et al. |
| 7,655,850 | B1 | 2/2010 | Ahn |
| 7,932,515 | B2 | 4/2011 | Bunyk |

(Continued)

FOREIGN PATENT DOCUMENTS

| WO | 2015178990 A2 | 11/2015 |
| WO | 2015178991 | 11/2015 |
| WO | 2015178992 A2 | 11/2015 |

OTHER PUBLICATIONS

Ristè D, Poletto S, Huang MZ, Bruno A, Vesterinen V, Saira OP, DiCarlo L. Detecting bit-flip errors in a logical qubit using stabilizer measurements. Nat Commun. Apr. 29, 2015;6:6983. doi: 10.1038/ncomms7983. PMID: 25923318; PMCID: PMC4421804. (Year: 2015).*

(Continued)

*Primary Examiner* — Daniel F. McMahon
(74) *Attorney, Agent, or Firm* — Henry Patent Law Firm PLLC

(57) ABSTRACT

In a general aspect, a quantum error-correction technique includes applying a first set of two-qubit gates to qubits in a lattice cell, and applying a second, different set of two-qubit gates to the qubits in the lattice cell. The qubits in the lattice cell include data qubits and ancilla qubits, and the ancilla qubits reside between respective nearest-neighbor pairs of the data qubits. After the first and second sets of two-qubit gates have been applied, measurement outcomes of the ancilla qubits are obtained, and the parity of the measurement outcomes is determined.

8 Claims, 13 Drawing Sheets

(56) References Cited

U.S. PATENT DOCUMENTS

| | | | |
|---|---|---|---|
| 8,642,998 B2 | 2/2014 | Gambetta et al. | |
| 8,872,360 B2 | 10/2014 | Chow et al. | |
| 9,317,473 B2 | 4/2016 | Yao et al. | |
| 10,056,908 B2 | 8/2018 | Rigetti et al. | |
| 10,352,992 B1 | 7/2019 | Zeng et al. | |
| 10,852,346 B1 | 12/2020 | Zeng et al. | |
| 2004/0109631 A1* | 6/2004 | Franson | B82Y 10/00 385/15 |
| 2004/0119061 A1 | 6/2004 | Wu et al. | |
| 2006/0169877 A1 | 8/2006 | Goto et al. | |
| 2007/0194225 A1 | 8/2007 | Zorn | |
| 2010/0079833 A1 | 4/2010 | Langford et al. | |
| 2010/0251049 A1 | 9/2010 | Goto et al. | |
| 2014/0025926 A1* | 1/2014 | Yao | G06F 15/78 712/32 |
| 2014/0264285 A1* | 9/2014 | Chow | B82Y 10/00 257/31 |
| 2015/0034808 A1 | 2/2015 | Yuan et al. | |
| 2016/0267032 A1 | 9/2016 | Rigetti et al. | |
| 2017/0116542 A1 | 4/2017 | Shim et al. | |

OTHER PUBLICATIONS

United States Receiving Office, International Search Report and Written Opinion for PCT App. No. PCT/US15/67416 dated Mar. 11, 2016, 12 pages.
USPTO, Notice of Allowance dated Apr. 20, 2018, in U.S. Appl. No. 15/121,483, 15 pgs.
USPTO, Office Action in U.S. Appl. No. 15/121,483 dated Jul. 28, 2017, 36 pages.
Third-Party Submission Under 37 CFR 1.290 filed Aug. 21, 2017, in U.S. Appl. No. 15/121,483, 8 pages.
Blais, Alexandre, et al., "Cavity quantum electrodynamics for superconducting electrical circuits: an architecture for quantum computation", arXiv:cond-mat/0402216v1 [cond-mat.mes-hall], Feb. 2008, 14 pages.
Bombin, Hector, "Gauge Color Codes: Optimal Transversal Gates and Gauge Fixing in Topological Stabilizer Codes", arXiv:1311.0879v6 [quant-ph], Aug. 6, 2015, 10 pages.
Braumuller, Jochen, "Development of tunable transmon qubit in microstrip geometry", Karlsruhe Institute of Technology, Dec. 12, 2013, 96 pages.
Chow, J., "Quantum Information Processing with Superconducting Qubits—Chapter 4.", Dissertation, Yale School of Engineering and Applied Sciences, May 2010, 39 pages.
Corcoles, A. D., et al., "Demonstration of a quantum error detection code using a square lattice of four superconducting qubits, Nature Communications", DOI: 10.1038/ncomms7979, Apr. 29, 2015, 10 pgs.
Devitt, Simon J, et al., "Programming a Topological Quantum Computer", arXiv:1209.1441 [quant-ph], Sep. 7, 2012, 6 pages.
Dicarlo, L, et al., "Demonstration of two-qubit algorithms with a superconducting quantum processor", Nature, vol. 460, 240, Jul. 9, 2009, 5 pages.
Egger, D. J., et al., "Optimized controlled-Z gates for two superconducting qubits coupled through a resonator", Supercond. Sci. Technol. 27 (2014) 014001, Nov. 26, 2013, 12 pages.
Ekert, Artur, et al., "Geometric Quantum Computation", arXiv:quant-ph/004015v1, Feb. 1, 2008, 15 pages.
Fowler, Austin G., "2D color code quantum computation", arXiv:0806.4827v3 [quant-ph], Jan. 10, 2011, 9 pages.
Fowler, Austin G., et al., "High threshold universal quantum computation on the surface code", arXiv:0803.0272v5, Physical Review A 80, 052312, Dec. 12, 2012, 20 pages.
Fowler, Austin G., "Surface codes: Towards practical large-scale quantum computation", Physical Review A 86, 032324, Sep. 18, 2012, 48 pages.
Ghosh, Joydip, et al., "High-fidelity controlled-oZ gate for resonator-based superconducting quantum computers", Physical Review A 87, 022309, Feb. 8, 2013, 19 pages.
Kubica, Aleksander, et al., "Unfolding the Color Code", New Journal of Physics 17, 083026, Aug. 13, 2015, 26 pages.
Landahl, Andrew J., et al., "Fault-tolerant quantum computing with color codes", arXiv:1108.5738v1 [quant-ph], Aug. 29, 2011, 28 pages.
McKay, David C., et al., "A universal gate for fixed-frequency qubits via a tunable bus", arXiv:1604.03076v2 [quant-ph], Aug. 18, 2016, 9 pages.
McKay, David C., et al., "A universal gate for fixed-frequency qubits via a tunable bus", arXiv:1604.03076v3 [quant-ph], Dec. 19, 2016, 12 pages.
Naik, R. K., et al., "Random access quantum information processors", arXiv:1705.00579v1 [quant-ph], May 1, 2017, 7 pages.
Richer, Susanne, "Perturbative analysis of two-qubit gates on transmon qubits", Thesis, RWTH Aachen University, Sep. 2013, 70 pages.
Rigetti, Chad Tyler, "Quantum Gates for Superconducting Qubits", Section 5; Dissertation—Yale University, May 2009, 46 pages.
Schuster, David Isaac, "Circuit Quantum Electrodynamics", Dissertation presented to the faculty of the graduate school, Yale University, May 1, 2007, 255 pages.
Strand, J. D., et al., "First-order sideband transitions with flux-driven asymmetric transmon qubits", arXiv:1301.0535v2 [cond-mat.supr-con] (Journal Ref: Phys. Rev. B 87, 220505, 2013), Jun. 21, 2013, 7 pages.
Strauch, Frederick W., et al., "Quantum Logic Gates for Coupled Superconducting Phase Qubits", Physical Review Letters, vol. 91, No. 167005, Oct. 16, 2003, 4 pages.
Strauch, Frederick W., "Quantum logic gates for superconducting resonator qudits", Physical Review A, 84, 052313, Nov. 2011, 9 pages.

\* cited by examiner

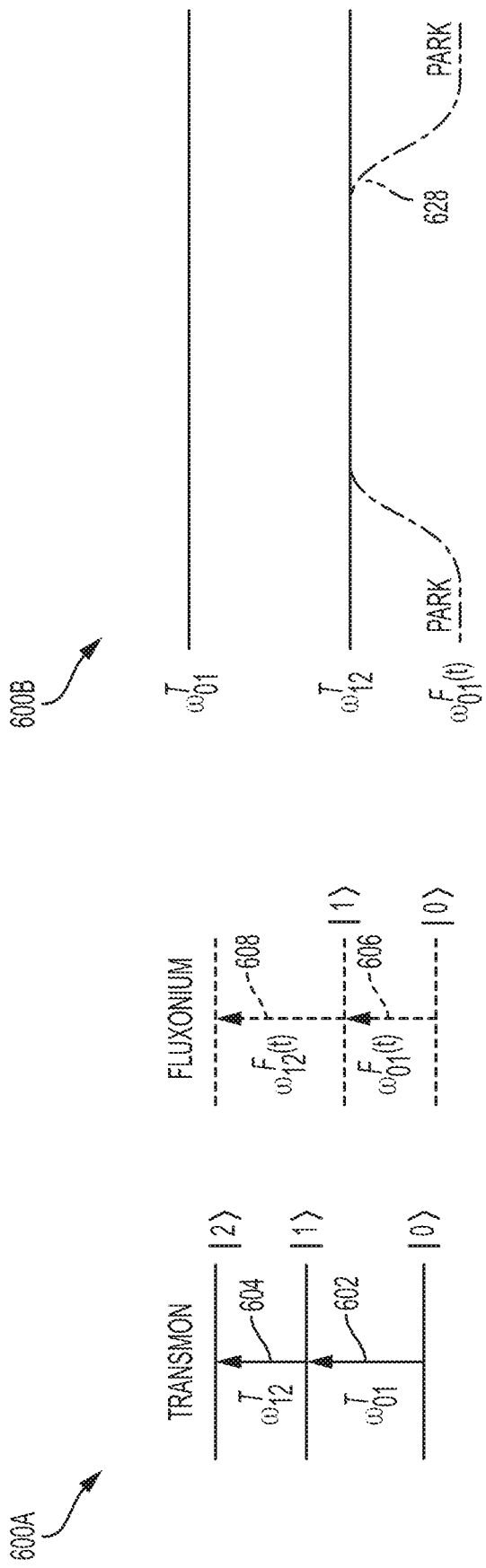

US 11,573,259 B1

QUANTUM ERROR-CORRECTION IN MICROWAVE INTEGRATED QUANTUM CIRCUITS

CROSS-REFERENCE TO RELATED APPLICATIONS

This application is a divisional of U.S. patent application Ser. No. 17/066,187, filed Oct. 8, 2020. Which is a continuation of U.S. patent application Ser. No. 16/424,901, filed May 29, 2019, now U.S. Pat. No. 10,852,346, which is a divisional of U.S. patent application Ser. No. 15/380,822, filed Dec. 15, 2016, now U.S. Pat. No. 10,352,992, which claims priority to U.S. Provisional Application No. 62/277,256, filed Jan. 11, 2016, the disclosures of which are hereby incorporated by reference.

BACKGROUND

The following description relates to quantum error-correction in microwave integrated quantum circuits.

Quantum computers can perform computational tasks by executing quantum algorithms. In some quantum computing architectures, quantum algorithms are executed on superconducting qubit devices that are subject to noise. Quantum error-correcting codes have been proposed for correcting errors, with the prospect of achieving fault-tolerant quantum computation.

DESCRIPTION OF DRAWINGS

FIG. 6A is a diagram of example energy levels.

FIG. 6B is a diagram of an example control sequence.

DETAILED DESCRIPTION

In some aspects of what is described here, techniques for implementing a variety of topological quantum error-correcting codes in superconducting qubits are described. In some implementations, error-correcting codes can be used in quantum computing systems to implement fault-tolerant quantum computation. Some example error-correcting codes, such as topological codes and others, use parity measurements between qubits arrayed in a lattice. An example is a class of error-correcting code known as surface codes, where data qubits are placed at the vertices of a square lattice. In some cases, one or more of the techniques described here can be used to implement error-correcting codes with low-overhead.

In some cases, one or more of the quantum error-correction schemes described here can be applied to square lattices or other types of lattices, for example, as two-dimensional or three-dimensional color codes. In some cases, one or more of the quantum error-correction schemes described here can be implemented in lattices where data qubits are placed on edges of a square lattice, lattices where data qubits are placed on corners of a square lattice, or possibly other types of lattices. In some examples, quantum error-correcting codes can be implemented using two-qubit gates applied to pairs of data qubits that are connected by an edge of a square lattice. Such error-correcting codes can also use parity measurements (e.g., X- and Z-parity measurements) on faces of the square lattice. The parity measurements can be implemented, for example, using ancilla qubits.

In some implementations, coupler devices that can be used for gate operations in a quantum computing system can be used as ancilla qubits for quantum error-correction (e.g., for face parity measurements). In such cases, the devices that are used as ancilla qubits in the error-correction schemes are already present in the main architecture of the quantum computing system, which can reduce the complexity of deploying error-correction schemes.

In some implementations, parity extraction for quantum error-correction can be performed using two-qubit interactions, which can reduce the likelihood of errors in some cases. In some examples, quantum-error correction is performed by applying two-qubit gates in a system of superconducting devices. The superconducting devices may include, for example, transmon devices, fluxonium devices or a combination of these and other types of devices. The two-qubit gates may include controlled-not (CNOT) gates or other types of two-qubit gates applied to qubits defined by transmon and fluxonium devices. In some cases, a CNOT gate can be implemented with higher fidelity, for instance, where the energy levels of the fluxonium device have a higher anharmonicity.

Figure 1:
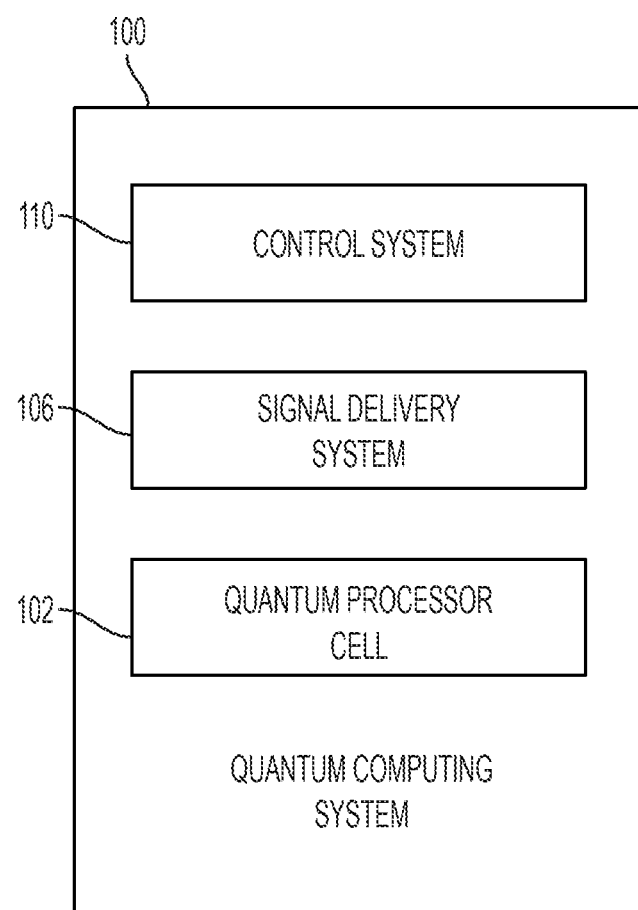
FIG. 1 is a block diagram of an example quantum computing system.

FIG. 1 is a block diagram of an example quantum computing system 100. The example quantum computing system 100 shown in FIG. 1 includes a control system 110, a signal delivery system 106, and a quantum processor cell 102. A quantum computing system may include additional or different features, and the components of a quantum computing system may operate as described with respect to FIG. 1 or in another manner.

The example quantum computing system 100 shown in FIG. 1 can perform quantum computational tasks by executing quantum algorithms. In some implementations, the quantum computing system 100 can perform quantum computation by storing and manipulating information within quantum states of a composite quantum system. For example, qubits (i.e., quantum bits) can be stored in and represented by an effective two-level sub-manifold of a quantum coherent physical system. Coupler devices can be used to perform quantum logic operations on single qubits or conditional quantum logic operations on multiple qubits. In some instances, the conditional quantum logic can be performed in a manner that allows large-scale entanglement within the quantum computing device. Control signals can manipulate the quantum states of individual qubits and the joint states of multiple qubits. In some instances, information can be read out from the composite quantum system by measuring the quantum states of the individual qubits.

In some implementations, the quantum computing system 100 can operate using gate-based models for quantum computing. In some models, fault-tolerance can be achieved by applying a set of high-fidelity control and measurement operations to the qubits. For example, topological quantum error-correction schemes can operate on a lattice of nearest-neighbor-coupled qubits. In some instances, these and other types of quantum error-correction schemes can be adapted for a two- or three-dimensional lattice of nearest-neighbor-coupled qubits, for example, to achieve fault-tolerant quantum computation. The lattice can allow each qubit to be independently controlled and measured without introducing significant errors on other qubits in the lattice. Adjacent pairs of qubits in the lattice can be addressed, for example, with two-qubit gate operations that are capable of generating entanglement, independent of other qubits in the lattice.

In some implementations, the quantum computing system 100 is constructed and operated according to a scalable quantum computing architecture. For example, in some cases, the architecture can be scaled to a large number of qubits to achieve large-scale general purpose coherent quantum computing. In some instances, the architecture is adaptable and can incorporate a variety of modes for each technical component. For example, the architecture can be adapted to incorporate different types of qubit devices, coupler devices, readout devices, signaling devices, etc.

The example quantum processor cell 102 shown in FIG. 1 includes qubit devices that are used to store and process quantum information. In some instances, all or part of the quantum processor cell 102 functions as a quantum processor, a quantum memory, or another type of subsystem. The quantum processor cell 102 shown in FIG. 1 can be implemented, for example, as the quantum processor cell 204 shown in FIG. 2A or in another manner.

In the example quantum processor cell 102, the qubit devices each store a single qubit (a bit of quantum information), and the qubits can collectively define the computational state of a quantum processor. For instance, the quantum processor cell 102 may include data qubits that are used to store and process quantum information, and ancilla qubits that are used to detect errors. In the example quantum processor cell 102, the qubit devices each store a single qubit, and the data qubits can collectively define a computational state.

The quantum processor cell 102 may also include readout devices that interact with the qubit devices to detect their quantum states. For example, the readout devices may generate readout signals that indicate the computational state of the quantum processor or quantum memory. The quantum processor cell 102 may also include coupler devices that selectively operate on individual qubits or pairs of qubits. For example, the coupler devices may produce entanglement or other multi-qubit states over two or more qubits in the quantum processor cell 102.

In some implementations, the example quantum processor cell 102 can process the quantum information stored in the qubits by applying control signals to the qubit devices or to the coupler devices housed in the quantum processor cell. The control signals can be configured to encode information in the qubit devices, to process the information by performing logical gates or other types of operations, or to extract information from the qubit devices. In some examples, the operations can be expressed as single-qubit gates, two-qubit gates, or other types of logical gates that operate on one or more qubits. A sequence of operations can be applied to the qubits to perform a quantum algorithm. The quantum algorithm may correspond to a computational task, a quantum error-correction procedure, a quantum state distillation procedure, or a combination of these and other types of operations.

In the example shown in FIG. 1, the signal delivery system 106 provides communication between the control system 110 and the quantum processor cell 102. For example, the signal delivery system 106 can receive control signals (e.g., qubit control signals, readout control signals, coupler control signals, etc.) from the control system 110 and deliver the control signals to the quantum processor cell 102. In some instances, the signal delivery system 106 performs preprocessing, signal conditioning, or other operations to the control signals before delivering them to the quantum processor cell 102.

In the example quantum computing system 100 shown in FIG. 1, the control system 110 controls operation of the quantum processor cell 102. The example control system 110 may include data processors, signal generators, interface components and other types of systems or subsystems. In some cases, the control system 110 includes one or more classical computers or classical computing components.

In some aspects of operation, information is encoded in data qubits defined in the quantum processor cell 102. For example, a single qubit of information may be written to, stored on or otherwise encoded in each data qubit. In some cases, to encode information in the data qubits, the control system 110 sends control signals to the quantum processor cell 102. The control signals can be configured to modify the quantum states of the respective data qubits to which they are addressed. For example, the control signals may be configured to transit the data qubits to a particular computational state, to apply logical operations to the data qubits, or to otherwise encode information in the data qubits. In some cases, information can be encoded in the data qubits in another manner, for example, by a thermal process or otherwise. The information encoded in the data qubits can then be processed, for example, by applying a quantum logic sequence to the data qubits. In some instances, quantum error-correcting codes are applied to detect (and in some instances, to correct) errors that occur, for example, as a result of noise processes acting on the data qubits. Ancilla qubits may be used in the quantum error-correction operations, for instance, to detect errors on the data qubits.

Figure 2A:
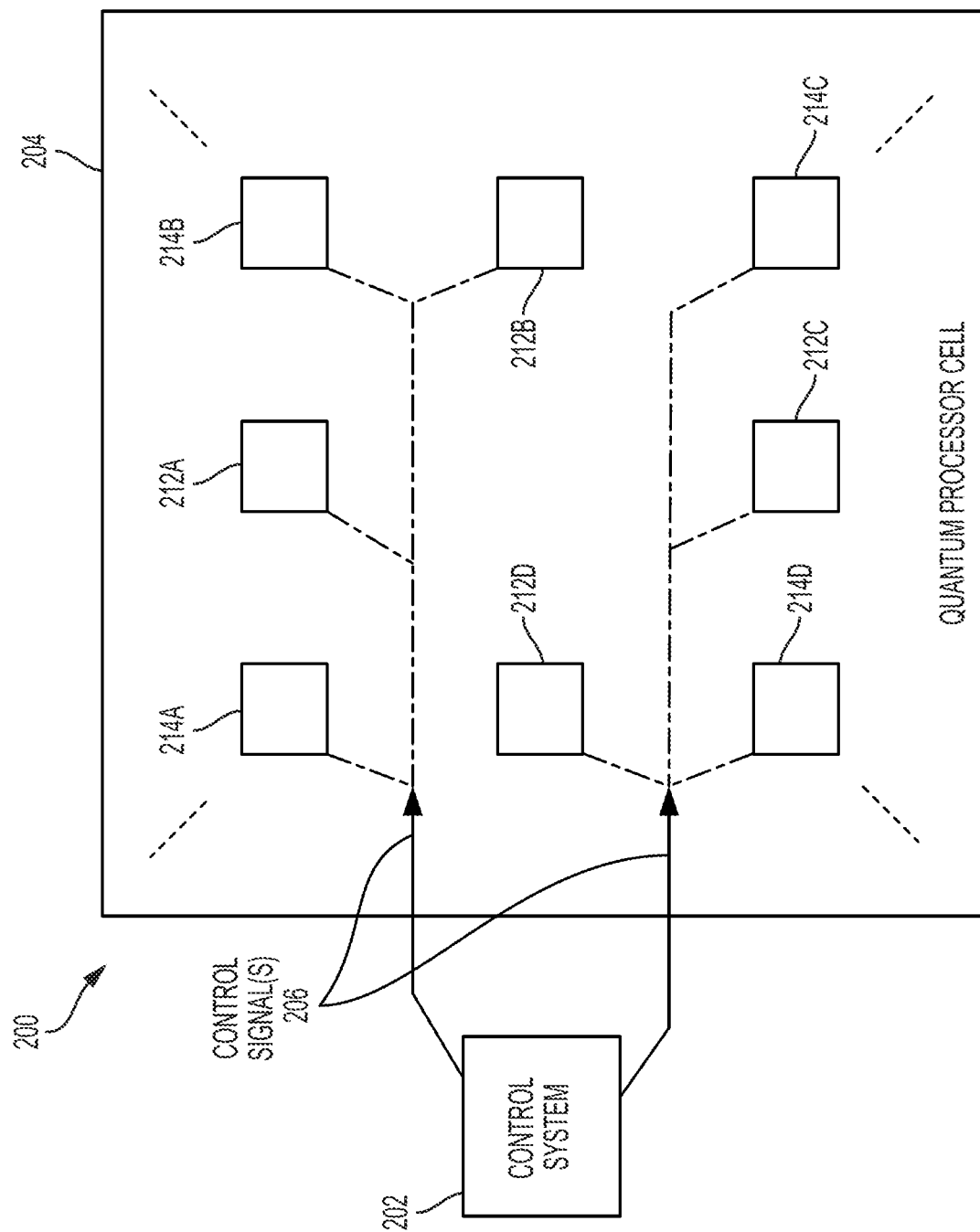
FIG. 2A is a block diagram showing devices in an example quantum computing system.

FIG. 2A is a block diagram showing devices and interactions in an example quantum computing system 200. As shown in FIG. 2A, the example quantum computing system 200 includes a control system 202 and a quantum processor cell 204. The quantum computing system 200 may include additional or different features, and the components may be arranged in another manner.

The example quantum processor cell 204 includes a two-dimensional or three-dimensional device lattice, which includes coupler devices and qubit devices arranged to form a device lattice. Eight of the devices in the device lattice are shown in FIG. 2A. In particular, FIG. 2A shows four coupler devices 212A, 212B, 212C, 212D and four qubit devices 214A, 214B, 214C, 214D. The example quantum processor cell 204 may include additional qubit devices, coupler devices or a combination of these and other components. In some examples, the devices are implemented as fluxonium devices, transmon devices or a combination of them. The coupler devices and qubit devices may be implemented as other types of devices.

In the example shown in FIG. 2A, the devices form a rectilinear (e.g., rectangular or square) lattice that extends in two spatial dimensions (in the plane of the page), and each coupler device has four nearest-neighbor qubit devices. In some implementations, the devices can be arranged to form another type of ordered array. Neighboring groups of devices in the lattice form lattice cells that are used, for example, in quantum error-correcting codes or other schemes. In some instances, the rectilinear lattice also extends in a third spatial dimension (in/out of the page), for example, to form a cubic lattice or another type of three-dimensional rectilinear lattice. The quantum processor cell 204 may include additional devices, including additional qubit devices, coupler devices and other types of devices.

In the example shown in FIG. 2A, the control system 202 is coupled with the quantum processor cell 204. For example, the control system 202 can be communicably coupled with the quantum processor cell 204, such that the control system 202 and the quantum processor cell 204 can exchange electromagnetic signals (e.g., microwave signals, radio-frequency signals, low-frequency or DC signals, etc.). In some implementations, the control system 202 is communicably coupled with the quantum processor cell 204 through a signal delivery system that includes connector hardware elements. For example, the connector hardware can include signal lines, signal processing hardware, filters, feedthrough devices and other types of components. In some implementations, the connector hardware can span multiple different temperature and noise regimes. For example, the connector hardware can include a series of temperature stages (60 K, 3 K, 800 mK, 150 mK) that decrease between a higher temperature regime of the control system 202 and a lower temperature regime of the quantum processor cell 204.

The quantum processor cell 204, and in some cases all or part of the signal delivery system and connection hardware elements, can be maintained in a controlled cryogenic environment. The environment can be provided, for example, by shielding equipment, cryogenic equipment, and other types of environmental control systems. In some examples, the components in the quantum processor cell 204 operate in a cryogenic temperature regime and are subject to very low electromagnetic and thermal noise. For example, magnetic shielding can be used to shield the system components from stray magnetic fields, optical shielding can be used to shield the system components from optical noise, thermal shielding and cryogenic equipment can be used to maintain the system components at controlled temperature, etc.

The example control system 202 shown in FIG. 2A may include, for example, a signal generator system, a program interface, a signal processor system and possibly other components. In some instances, components of the control system 202 can operate in a room temperature regime, an intermediate temperature regime, or both. For example, the control system 202 can be configured to operate at much higher temperatures and be subject to much higher levels of noise than that present in the environment of the quantum processor cell 204.

In some implementations, the quantum processor cell 204 provides a low-noise electromagnetic environment for the qubit devices in the quantum processor cell 204. For instance, an electromagnetic waveguide system, a cap wafer that defines cavities or another type of structure may provide an environment for a lattice of devices (e.g., qubit devices, coupler devices, and possibly others). In some instances, the structure of the quantum processor cell 204 includes apertures, vias or other features that allow the delivery of signals to the lattice of qubit devices and coupler devices, and allow the extraction of readout signals from readout devices.

In the example shown in FIG. 2A, the coupler devices 212A, 212B, 212C, 212D reside between respective nearest-neighboring pairs of the qubit devices 214A, 214B, 214C, 214D in a device lattice within the quantum processor cell 204. In some implementations, the qubit devices can be controlled individually, for example, by delivering control signals to the coupler devices or qubit devices. In some implementations, the qubit devices can interact with each other through the coupler devices. The interactions between neighboring qubit devices can be controlled, for example, by delivering tuning pulses to the individual coupler devices. In some cases, readout devices can detect the states of the qubit devices, for example, by interacting directly with the respective qubit devices.

In the example shown in FIG. 2A, the qubit devices 214A, 214B, 214C, 214D can each be encoded with a single qubit. Each of the qubit devices has two eigenstates used as computational basis states ("0" and "1"), and each qubit device can transition between its computational basis states or exist in an arbitrary superposition of its basis states. The quantum states of the respective qubit devices can be manipulated by control signals generated by the control system 202.

Figure 2B:
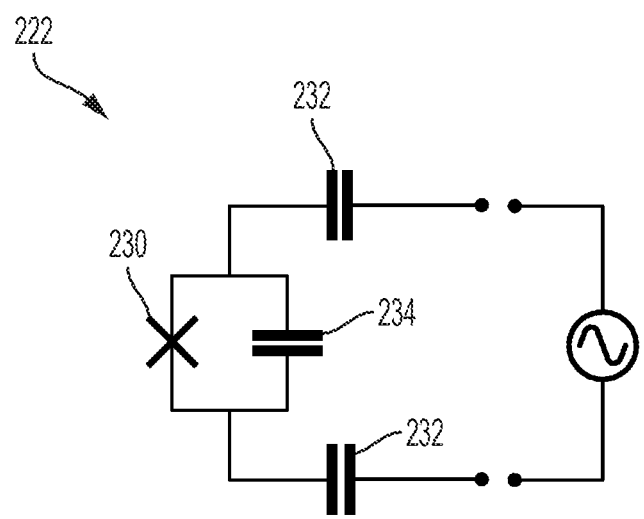
FIG. 2B shows an equivalent circuit for an example transmon device.

In some examples, one or more of the devices in the quantum processor cell 204 can be implemented by charged-based qubit devices, such as, for example, the transmon device shown in FIG. 2B. In some examples, one or more of the devices in the quantum processor cell 204 can be implemented by a flux-based qubit, such as, for example, the fluxonium device shown in FIG. 2C. Other types of devices may be used.

In some examples, each qubit device in the quantum processor cell 204 has a fixed qubit operating frequency that is defined by an electronic circuit of the qubit device. For instance, a qubit device (e.g., when implemented as a transmon device) may be implemented without a superconducting quantum interference device (SQUID) loop. In some examples, the qubit operating frequency of a qubit device is tunable, for example, by application of an offset field. For instance, a qubit device (e.g., when implemented as a fluxonium device) may include a SQUID loop that is tunable by application of magnetic flux.

In some implementations, the coupler devices in the quantum processor cell 204 allow the qubits to be selectively coupled to each other, to perform single-qubit gates, to perform multi-qubit gates, to entangle neighboring pairs of qubits, or to perform other types of operations.

In some examples, each coupler device has a tunable operating frequency. For example, the operating frequency may be tunable by applying a tuning pulse to the coupler device. The tuning pulse may generate, for example, a magnetic bias field that tunes the operating frequency of the coupler device. As a particular example, a coupler device may include a superconducting quantum interference device (SQUID) loop whose resonance frequency defines the operating frequency of the coupler device, and the resonance frequency of the SQUID loop may be controlled by a tuning pulse. For instance, the coupler device can include an inductor that is coupled to the SQUID loop by a mutual inductance, and the magnetic flux through the SQUID loop can be controlled by the DC component of the current through the inductor.

In some cases, the operating frequency of a coupler device determines the coupling strength with one or more neighboring qubit devices. For instance, the coupling strength may be increased by setting the resonance frequency of the SQUID loop in a frequency range near the resonance frequency of either qubit device. In such examples, the resonance frequency of the SQUID loop can be tuned by controlling the amount of magnetic flux experienced by the SQUID loop. Thus, manipulating the magnetic flux can increase or decrease the resonance frequency of the SQUID loop, which in turn influences the coupling strength with neighboring qubit devices.

In some implementations, coupler devices that are tunable by application of an offset field are used with qubit devices that do not respond to offset fields. This may allow the coupler devices to be selectively activated by an offset field that does not disturb the information encoded in the qubit device. For instance, although the offset field may cause the coupler device to produce an electromagnetic interaction between neighboring qubit devices, the offset field does not directly interact with the qubit device or disturb the quantum state of the qubit device even if the qubit device experiences the offset field. Thus, the combination of tunable couplers with fixed-frequency qubit devices may allow selective coupling of qubit devices while improving performance of the qubit devices. For example, the fixed-frequency qubit devices may have longer coherence times, may be more robust against environmental or applied offset fields, etc.

In some instances, information is encoded in the qubit devices, and the information can be processed by operation of the coupler devices. For instance, input information can be encoded in the computational states or computational subspaces defined by some or all of the qubit devices. The information can be processed, for example, by applying a quantum algorithm or other operations to the input information. The quantum algorithm may be decomposed as gates or instruction sets that are performed by the qubit devices and coupler devices over a series of clock cycles. For instance, a quantum algorithm may be executed by a combination of single-qubit gates and two-qubit gates. In some cases, information is processed in another manner. Processing the information encoded in the qubit devices produces output information that can be extracted from the qubit devices. The output information can be extracted, for example, by performing state tomography or individual readout operations. In some instances, the output information is extracted over multiple clock cycles or in parallel with the processing operations.

In some aspects of operation, the control system 202 sends control signals 206 to the devices in the quantum processor cell. The control signals can include tuning pulses that change (increase or decrease) the respective operating frequencies of the coupler devices. For example, tuning signals can vary an offset electromagnetic field experienced by a coupler device, and varying the offset electromagnetic field can change the operating frequency of the coupler device. In some implementations, the tuning pulse can be a direct current (DC) electrical signal that is communicated from the control system 202 to the individual device. The control signals can include microwave pulses that drive transitions in the respective coupler devices and qubit devices. For example, microwave signals can be generated at or near the operating frequency of a device to interact with the device's quantum energy levels. In some implementations, the microwave pulse can be an alternating current (AC) electrical signal that is communicated from the control system 202 to the individual device.

In some instances, a quantum error-correction scheme is applied to the devices in the quantum processor cell 204. In such cases, the coupler devices and qubit devices in the quantum processor cell 204 can form a device lattice for implementing the quantum error-correction scheme. For instance, one or more of the coupler devices 212A, 212B, 212C, 212D can act as ancilla qubits and one or more of the qubit devices 214A, 214B, 214C, 214D can act as data qubits for the quantum error-correction scheme. The device lattice can include multiple lattice cells, with the ancilla qubits in each lattice cell residing between respective nearest-neighbor pairs of the data qubits in the lattice cell. The coupler devices 212A, 212B, 212C, 212D and qubit devices 214A, 214B, 214C, 214D shown in FIG. 2A form an example lattice cell. Quantum error-correction may be performed in another type of lattice cell.

In some aspects of operation, the control system 202 generates control signals 206 and sends the control signals to the quantum processor cell 204; the control signals are then delivered to the quantum processor cell 204 and cause the quantum processor cell 204 to execute the quantum error-correction scheme.

In some aspects of operation, the quantum error-correction scheme applied by the control system 202 is a surface code. For instance, the control system 202 may apply a two-dimensional or three-dimensional surface code to qubits in the device lattice. The two-dimensional surface code can be considered a stabilizer code on a three-valent, three-colorable lattice, where data qubits operate at the edges of a surface code lattice. The three-dimensional surface code can be considered a stabilizer code on a four-valent, four-colorable lattice, where data qubits operate at the edges of a surface code lattice. The stabilizers of the code can be implemented as parity measurements on faces and vertices of the surface code lattice. For instance, the face operators can measure the X-parity of the qubits around a face in the lattice cell, and the vertex operators can measure the Z-parity of the qubits incident on a single vertex of the lattice cell. The syndrome measurements of the code can be performed by measuring the stabilizers (e.g., X-stabilizers and Z-stabilizers) across the surface code lattice, and the stabilizer measurements can be decoded using classical decoding algorithms.

In some aspects of operation, the quantum error-correction scheme applied by the control system 202 is a color code. For instance, the control system 202 may apply a two-dimensional or three-dimensional color code to qubits in the device lattice. The two-dimensional color code can be considered a stabilizer code on a three-valent, three-colorable lattice, where data qubits operate at the vertices of a color code lattice. The three-dimensional color code can be considered a stabilizer code on a four-valent, four-colorable lattice, where data qubits operate at the vertices of a color code lattice. The stabilizers of the code can be implemented as parity measurements on faces of the color code lattice. The syndrome measurements of the code can be performed by measuring the stabilizers (e.g., X-stabilizers and Z-stabilizers) across the color code lattice, and the stabilizer measurements can be decoded using classical decoding algorithms.

Generally, a lattice of data qubits can be considered n-valent where each data qubit is directly connected with n other data qubits in the lattice. In some examples, a lattice is considered three-valent where each data qubit is directly connected with (exactly or at least) three other data qubits in the lattice, and a lattice is considered four-valent where each data qubit is directly connected with (exactly or at least) four other data qubits in the lattice. Data qubits that are directly connected in a lattice may be connected through circuitry or another type of device (e.g., a coupler device that defines an ancilla qubit, or another device).

Generally, a lattice of data qubits can be considered n-colorable where each cell of the lattice can be colored with one of n distinct colors, and each cell of the lattice contacts only unlike-colored cells in the lattice. In some examples, a lattice is considered three-colorable where each cell of the lattice can be colored with exactly one of three distinct colors, and each cell in the lattice contacts only unlike-colored cells in the lattice; and a lattice is considered four-colorable where each cell of the lattice can be colored with one of four distinct colors, and each cell in the lattice contacts only unlike-colored cells in the lattice. Cells (also called "solids") in a lattice contact if they are adjacent in the lattice, for example, if they share an edge, vertex or face. For example, in an n-colorable lattice, none of the cells of the lattice share an edge, vertex or face with another cell of the same color.

In some examples, aspects of the quantum error-correction scheme are executed by the control system 202 applying a first set of two-qubit gates (e.g., a first set of CNOT gates) to qubits in a lattice cell in the device lattice, and then applying a second, different set of two-qubit gates (e.g., a second set of CNOT gates) to the same qubits in the lattice cell. After applying the first and second sets of two-qubit gates, the control system 202 can obtain measurement outcomes of the ancilla qubits in the lattice cell, and determine a parity of the measurement outcomes. The parity of the measurement outcomes may be used as a stabilizer in a quantum error-correction code. For instance, the parity of the measurement outcomes can be used to detect and correct errors in the data qubits in a color code or surface code applied to the lattice. In this context, the parity of a set of measurement outcomes can be a binary value that indicates whether the set of measurement outcomes contains an odd or even number of ones. According to convention, a parity value of one indicates an odd number of ones, and a parity of zero indicates an even number of ones.

In some aspects of operation, each two-qubit gate in the first and second sets of two-qubit gates is applied to a respective pair of qubits in the lattice cell. Each pair of qubits can be one of the data qubits and one of the ancilla qubits. In some aspects of operation, each two-qubit gate in the first and second sets of two-qubit gates is applied to a distinct pair of the qubits in the lattice cell.

In some aspects of operation, each two-qubit gate in the first and second sets of two-qubit gates is a controlled-not gate. The controlled-not gates in the first set and the controlled-not gates in the second set can be applied to respective pairs of devices in the lattice cell, with one of the data qubits as the control and one of the ancilla qubits as the target. As an example, the first set of controlled-not gates can include a controlled-not gate with a first data qubit (e.g., defined by qubit device 214A) as the control and a first ancilla qubit (e.g., defined by coupler device 212A) as the target; a controlled-not gate with a second data qubit (e.g., defined by qubit device 214B) as the control and a second ancilla qubit (e.g., defined by coupler device 212B) as the target; a controlled-not gate with a third data qubit (e.g., defined by qubit device 214C) as the control and a third ancilla qubit (e.g., defined by coupler device 212C) as the target; and a controlled-not gate with a fourth data qubit (e.g., defined by qubit device 214D) as the control and a fourth ancilla qubit as the target (e.g., defined by coupler device 212D). Similarly, the second set of controlled-not gates can include a controlled-not gate with the first data qubit as the control and the fourth ancilla qubit as the target; a controlled-not gate with the second data qubit as the control and the first ancilla qubit as the target; a controlled-not gate with the third data qubit as the control and the second ancilla qubit as the target; and a controlled-not gate with the fourth data qubit as the control and the third ancilla qubit as the target.

Figure 2C:
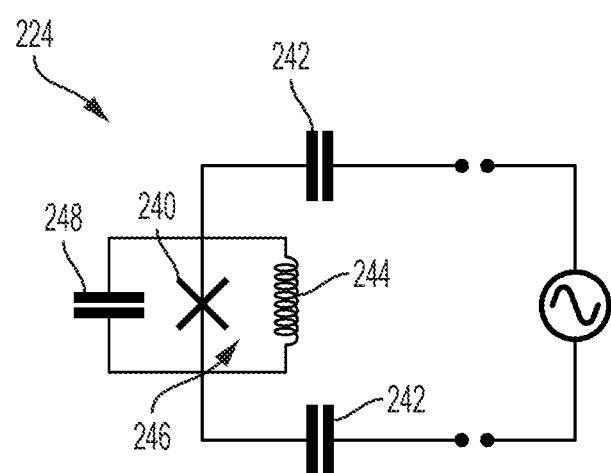
FIG. 2C shows an equivalent circuit for an example fluxonium device.
Figure 2D:
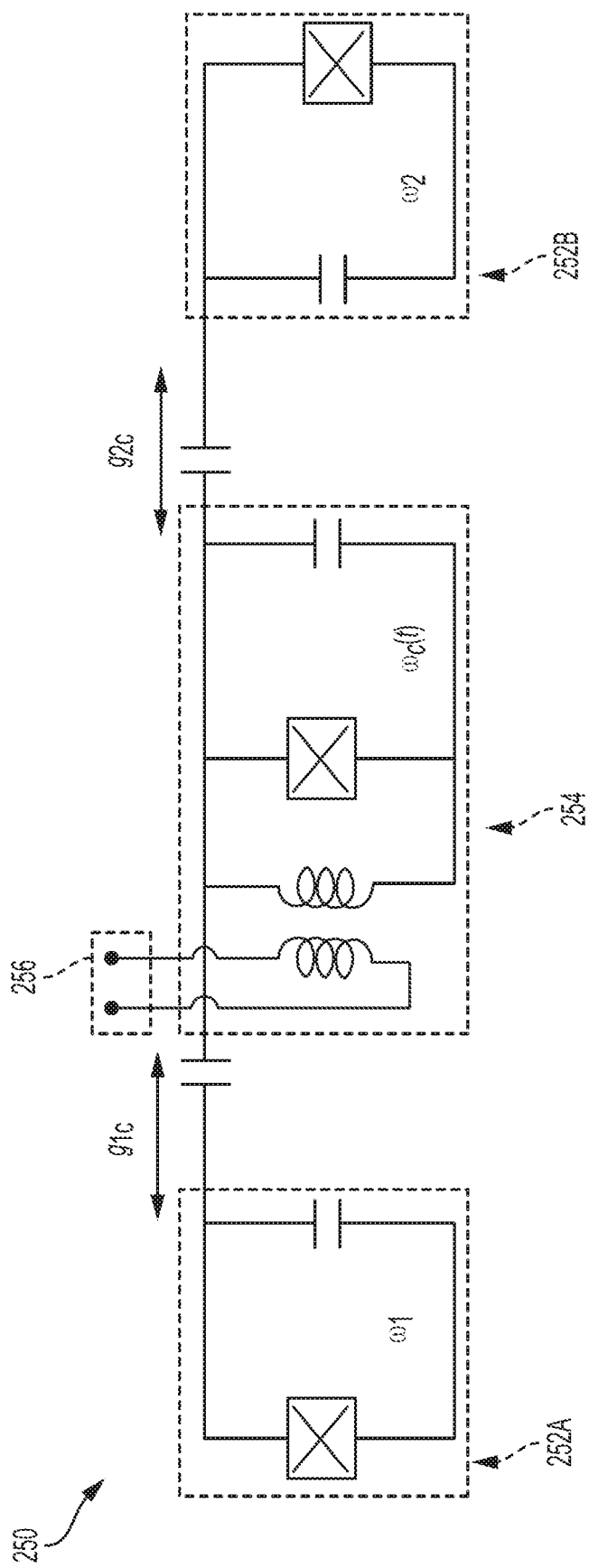
FIG. 2D shows an equivalent circuit for devices in an example quantum computing system.

FIGS. 2B, 2C and 2D show aspects of example devices that may be included in the quantum processor cell 204. The quantum processor cell 204 may include additional or different types of devices. The qubit devices and coupler device in the quantum processor cell 204 may be implemented as charge qubit devices, flux qubit devices or other types of devices. In some examples, the qubit devices 214A, 214B, 214C, 214D can be implemented as transmon devices, and the coupler devices 212A, 212B, 212C, 212D can be implemented as fluxonium devices. In some examples, the qubit devices 214A, 214B, 214C, 214D can be implemented as fluxonium devices, and the coupler devices 212A, 212B, 212C, 212D can be implemented as transmon devices. In some examples, coupler devices 212A, 212B, 212C, 212D and the qubit devices 214A, 214B, 214C, 214D can all be implemented as fluxonium devices. In some examples, coupler devices 212A, 212B, 212C, 212D and the qubit devices 214A, 214B, 214C, 214D can all be implemented as transmon devices. In some cases, it is beneficial to use a highly anharmonic system as a coupler device, with energy levels having large anharmonicity. In some cases, such properties can be achieved using a fluxonium device as a coupler device.

FIG. 2B shows an equivalent circuit 222 for an example transmon device. The transmon device represented in FIG. 2B is an example of a charge qubit device. In some cases, a transmon device can be fabricated on a substrate (e.g., formed from sapphire, silicon, etc.) that supports a superconducting thin film (e.g., formed from aluminum, niobium, etc.). For instance, the transmon device may be fabricated by double-angle evaporation of thin-film aluminum onto a sapphire or silicon substrate, or by another fabrication process. The example transmon device shown in FIG. 2B includes a Josephson junction 230 and a shunt capacitance 234. In this example, the shunt capacitance 234 is formed in a topologically closed manner to reduce far-field coupling and spurious qubit couplings to other devices. The example transmon device can be coupled to another device or an electrode, for example, by a differential capacitance 232 formed between the other device and inner and outer electrodes of the Josephson junction 230.

FIG. 2C shows an equivalent circuit 224 for an example fluxonium device. The fluxonium device represented in FIG. 2C is an example of a flux qubit device. In some cases, a fluxonium device can be fabricated on a substrate (e.g., formed from sapphire, silicon, etc.) that supports a superconducting thin film (e.g., formed from aluminum, niobium, etc.). For instance, the fluxonium device may be fabricated by double-angle evaporation of thin-film aluminum onto a sapphire or silicon substrate, or by another fabrication process. The example fluxonium device shown in FIG. 2C includes a Josephson junction 240, a shunt inductance 244 and a shunt capacitance 248 connected in parallel and forming a loop. A magnetic flux signal 246 can be applied to the loop. The magnetic flux signal 246 can be applied to the loop, for example, by applying a tuning pulse to bias circuitry that has a mutual inductance with the loop. The input capacitance 242 across the Josephson junction 240 can provide a charge-coupling control port. The charge-coupling control port may be formed of a topologically closed capacitance, for instance, where an inner island is encircled by an outer island. In some implementations, a control or coupling port can be realized by coupling the device with a differential capacitance with respect to these two islands to a nearby electrode.

FIG. 2D shows an equivalent circuit 250 for devices in an example quantum computing system. In some examples, the devices represented in FIG. 2D are arranged within a larger device lattice or another type of ordered structure. For instance, the equivalent circuit 250 in FIG. 2D can represent any of the coupler devices and two nearest-neighbor qubit devices in the quantum processor cell 204 in FIG. 2A, or the equivalent circuit 250 in FIG. 2D can represent devices in another type of system or environment. The example devices represented in FIG. 2D includes a first qubit device 252A, a second qubit device 252B, a coupler device 254 and a control port 256. The devices may include additional or different features, and the components may be arranged as shown or in another manner.

In the example shown in FIG. 2D, the first and second qubit devices 252A, 252B are implemented as transmon devices. As shown, the qubit device circuitry includes a Josephson junction (represented by the symbol "X" in FIG. 2D) and a shunt capacitance. In the example shown in FIG. 2D, the coupler device 254 includes a fluxonium device and bias control circuitry. As shown, the fluxonium device circuitry includes a Josephson junction, a shunt inductance and a shunt capacitance. The bias circuitry includes an inductance loop that is connected to the control port 256 to receive tuning signals. Both qubit devices 252A, 252B are capacitively coupled to the coupler device 254 by respective differential capacitances. The qubit devices and coupler devices may be implemented by other types of systems, and the features and components represented in FIG. 2D can be extended in a larger two-dimensional or three-dimensional lattice of devices.

An example control port 256 is shown in FIG. 2D. In this example, the coupler device 254 includes bias circuitry that is coupled to the control port 256 to receive tuning signals. The bias circuitry in the example coupler device 254 is configured to apply an offset field to the fluxonium device circuitry. In particular, the bias circuitry includes an inductor that has a mutual inductance with the fluxonium device circuitry. In the example shown, a resonance frequency of the fluxonium device circuitry is the operating frequency of the example coupler device 254, and the magnetic flux generated by the bias circuitry controls the resonance frequency of the fluxonium device.

In the example shown in FIG. 2D, the operating frequency of the coupler device 254 can change (increase or decrease) in response to a tuning pulse received by the bias circuitry through the control port 256. In some instances, the operating frequency may be increased or decreased to a frequency range near the resonance frequency of either qubit device 252A, 252B. The resonance frequency of the coupler circuitry can be tuned by controlling the amount of magnetic flux experienced by the fluxonium device circuitry. Thus, manipulating the magnetic flux can increase or decrease the resonance frequency of the fluxonium device circuitry, which in turn influences the operating frequency of the coupler device 254.

In the example shown in FIG. 2D, because the inductor in the bias circuitry has a mutual inductance with the fluxonium device circuitry, the magnetic flux through the coupler circuitry can be controlled by the DC component of the current through the inductor. In some instances, the operating frequency is controlled in another manner, for instance, by another type of signal.

Figure 5:
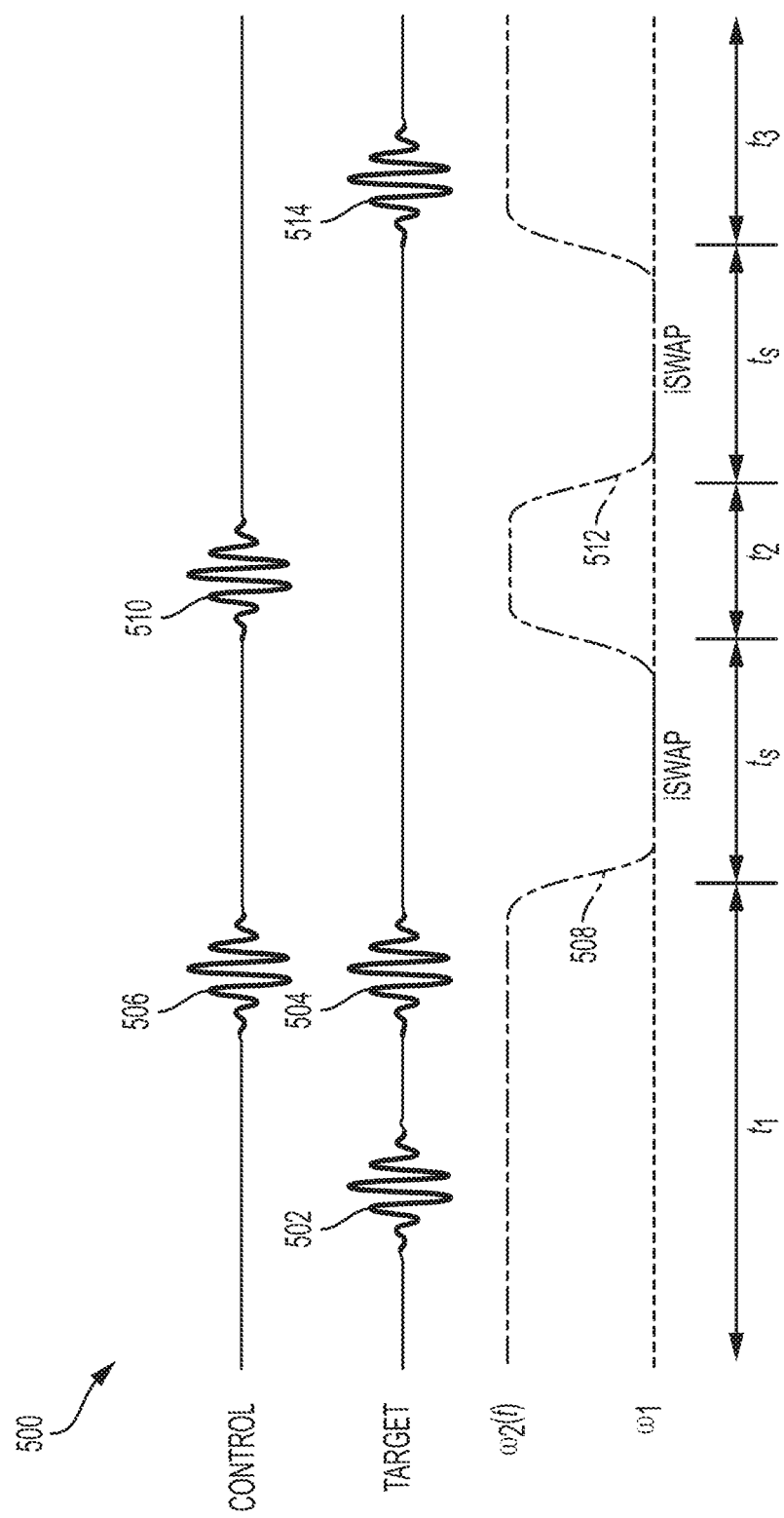
FIG. 5 is a diagram of an example control sequence.
Figure 9:
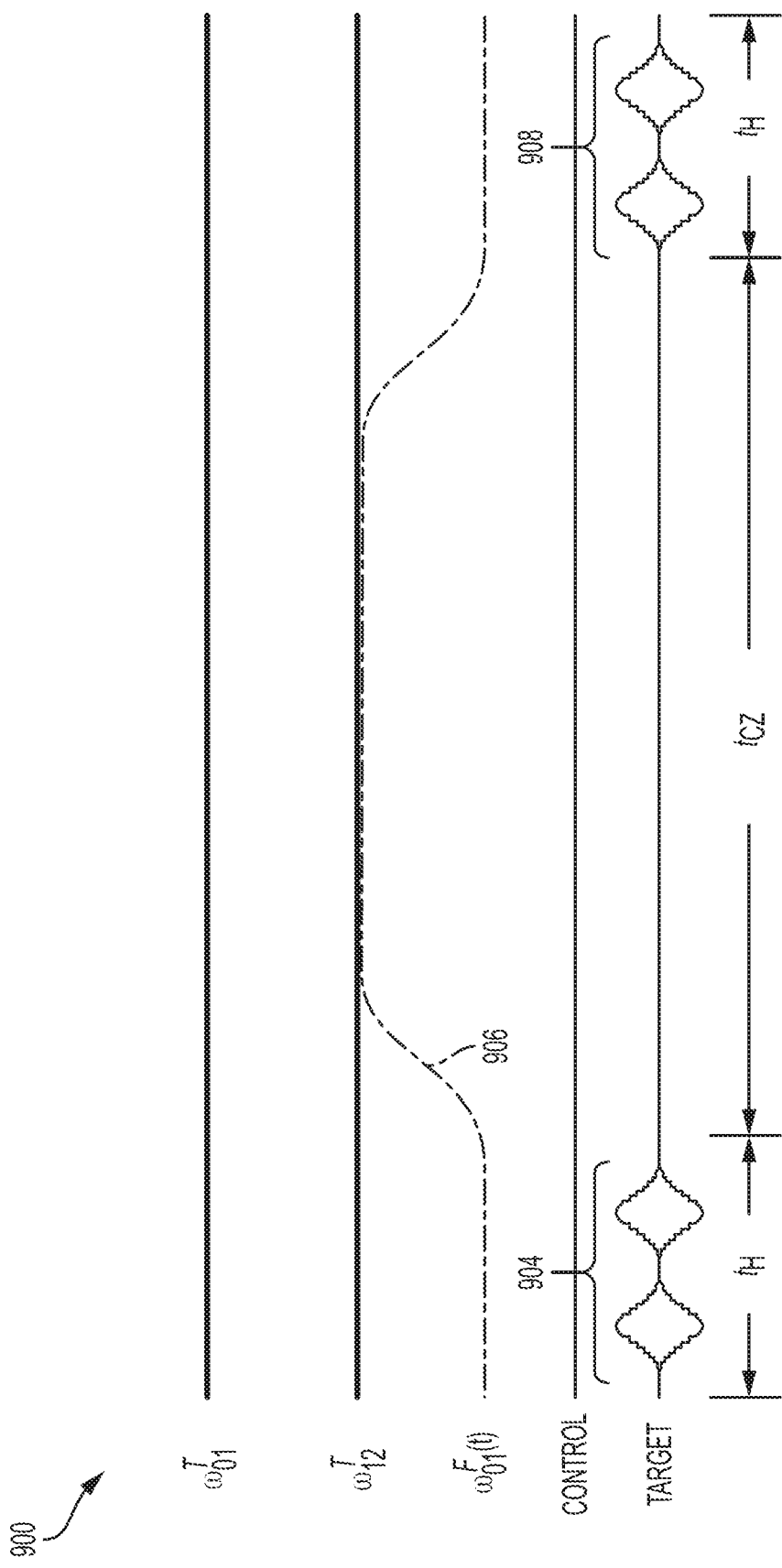
FIG. 9 is a diagram of an example control sequence.

The example circuitry shown in FIG. 2D can apply single-qubit gates to the quantum state of either qubit device 252A, 252B, as well as two-qubit gates to the collective quantum state of the qubit devices 252A, 252B. As shown in FIG. 2D, the parameter $g_{1c}$ represents the coupling strength between the first qubit device 252A and the coupler device 254, and the parameter $g_{2c}$ represents the coupling strength between the second qubit device 252A and the coupler device 254. Also shown in FIG. 2D, the two qubit devices 252A, 252B have fixed qubit operating frequencies $\omega_1$ and $\omega_2$, respectively, while the coupler device 254 has a tunable operating frequency $\omega_c(t)$ that changes over time. The tunability of the operating frequency can be used to generate controlled-not gates, controlled-phase gates, or other types of quantum logic gates on the qubit devices 252A, 252B (e.g., as shown in FIGS. 5, 6B and 9, or in another manner). For instance, by tuning the operating frequency close to either of the qubit operating frequencies, a phase interaction can be generated between the two qubit devices 252A, 252B to produce the single-qubit or two-qubit quantum logic gates.

In some cases, the coupler device 254 defines a qubit (e.g., an ancilla qubit for quantum error-correction, a data qubit for logical qubit encoding, etc.), and the example circuitry shown in FIG. 2D can apply two-qubit gates to the quantum state of the coupler device 254 and one of the qubit devices 252A, 252B. For example, a two-qubit gate can be applied to a first qubit defined by the coupler device 254 and a second qubit defined by the qubit device 252A. The control sequence configured to apply the two-qubit gate can include one or more tuning pulses for the coupler device 254 and possibly other pulses (e.g., microwave pulses for the coupler device, microwave pulses for the qubit device, etc.). As an example, the tuning pulse 508 shown in FIG. 5 can be used to apply an iSWAP gate to a pair qubits defined by the coupler device 254 and the qubit device 252A. As another example, the control sequence 500 shown in FIG. 5 (which includes both tuning pulses and microwave pulses) can be used to apply a controlled-not (CNOT) gate to a pair of qubits defined by the coupler device 254 and the qubit device 252A. As an example, the tuning pulse 906 shown in FIG. 9 can be used to apply a controlled-z (CZ) gate to a pair qubits defined by the coupler device 254 and the qubit device 252A. As another example, the control sequence 900 shown in FIG. 9 (which includes a tuning pulse and microwave pulses) can be used to apply a controlled-not (CNOT) gate to a pair of qubits defined by the coupler device 254 and the qubit device 252A.

In some cases, when the control sequence configured to apply the two-qubit gate is sent to the quantum processor cell, the tuning pulse is delivered to the coupler device 254 through the control port 256. The tuning pulse tunes the operating frequency of the coupler device 254 toward a transition frequency of the qubit device 252A to produce a quantum interaction between the coupler device 254 and the qubit device 252A. For instance, the tuning pulse may tune the operating frequency of the coupler device 254 to the $|0\rangle \rightarrow |1\rangle$ transition frequency of the qubit device 252A (e.g., as in the example shown in FIG. 5), or the tuning pulse may tune the operating frequency of the coupler device 254 to the $|1\rangle \rightarrow |2\rangle$ transition frequency of the qubit device 252A (e.g., as in the example shown in FIG. 9). The quantum interaction produced by the tuning pulse over a time period of the tuning pulse can cause the quantum state of the qubits to evolve according to the two-qubit gate (or a portion of the two-qubit gate).

In some implementations, the tuning pulse can be applied adiabatically. For example, the operating frequency of the coupler device 254 can be varied to slowly approach a small detuning with the transition frequency of the qubit device 252A (or 252B). In such cases, the tuning pulse can produce a quantum interaction that affects one transition of the qubit device 252A (or 252B) without affecting other transitions. In some implementations, the tuning pulse can be applied non-adiabatically. For example, the operating frequency of the coupler device 254 can be varied more quickly to the transition frequency of the qubit device 252A (or 252B). Tuning the operating frequency non-adiabatically can result in a faster gate, but may compromise fidelity in some instances. In some implementations, the fidelity can be improved by engineering the pulse shapes to block transitions to undesired energy levels.

Figure 3:
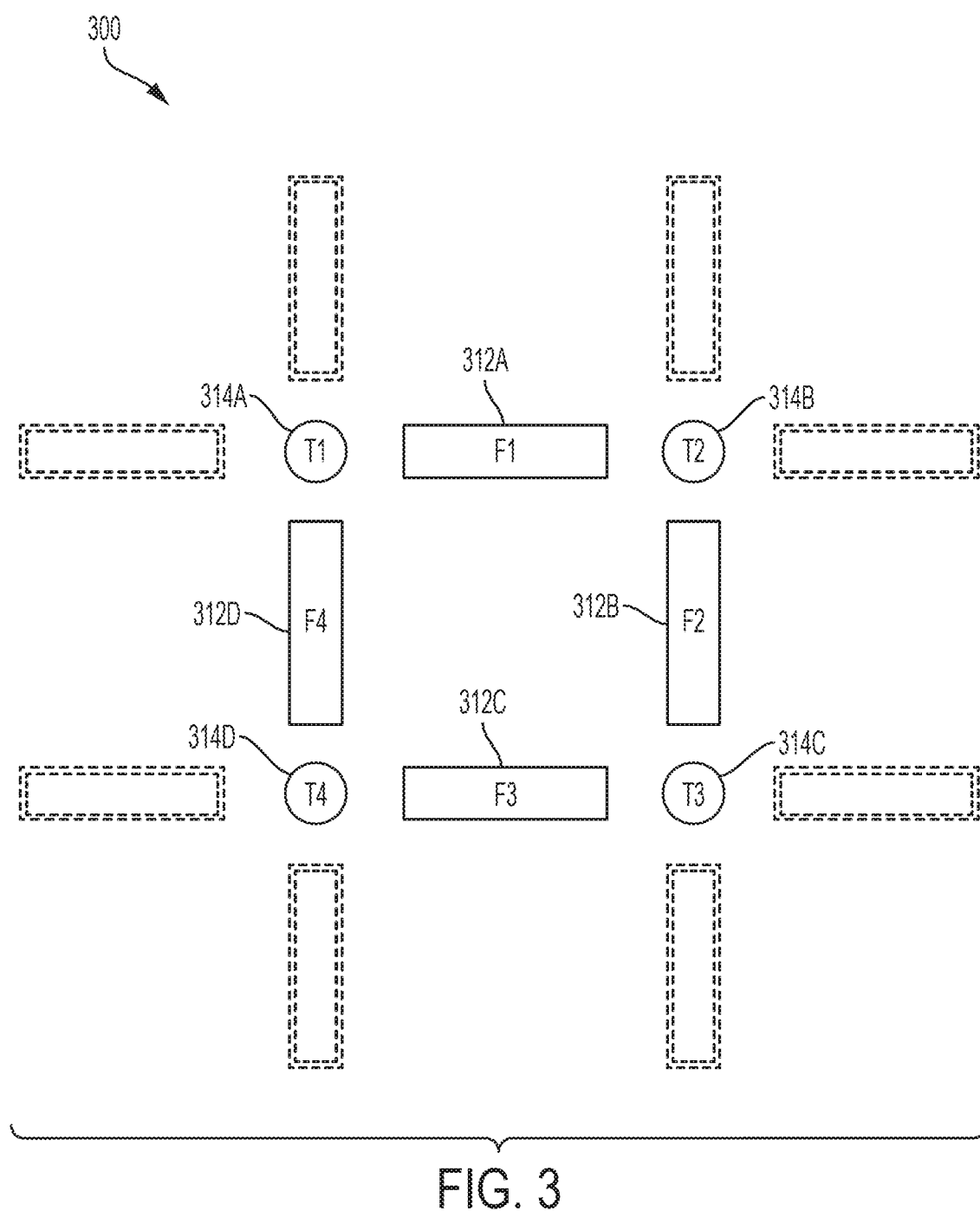
FIG. 3 is a block diagram showing an example device lattice in an example quantum computing system.

FIG. 3 is a block diagram showing an example device lattice 300 in an example quantum computing system. The example device lattice 300 shown in FIG. 3 includes fluxonium devices and transmon devices arranged in a two-dimensional lattice structure that includes an array of lattice cells, where each lattice cell includes a group of devices that neighbor each other in the lattice. The device lattice 300 includes lattice cells extending in two spatial dimensions. An example lattice cell shown in FIG. 3 includes four transmon devices T1, T2, T3, T4 and four fluxonium devices F1, F2, F3, F4. The fluxonium devices reside between respective nearest-neighbor pairs of the transmon devices in the lattice cell. Each of the lattice cells in the device lattice 300 may be configured as the example lattice cell shown in FIG. 3, or a lattice cell in the device lattice 300 may be configured in another manner. For example, a lattice cell may include other types of devices or the same types of devices in another arrangement. In some cases, an individual device in the device lattice 300 can be associated with multiple lattice cells. For instance, adjacent lattice cells may share a device on an edge, vertex or face.

In the example shown in FIG. 3, each of the devices can be electromagnetically coupled to its neighboring devices. For instance, the fluxonium device F1 can interact with its neighboring transmon devices T1, T2; the fluxonium device F2 can interact with its neighboring transmon devices T2, T3; the fluxonium device F3 can interact with its neighboring transmon devices T3, T4; and the fluxonium device F4 can interact with its neighboring transmon devices T4, T1. In addition, each nearest-neighbor pair of transmon devices can be electromagnetically coupled to each other by operation of the fluxonium device between them. For instance, the transmon devices T1, T2 can interact through the fluxonium device F1; the transmon devices T2, T3 can interact through the fluxonium device F2; the transmon devices T2, T3 can interact through the fluxonium device F3; and the transmon devices T4, T1 can interact through the fluxonium device F4.

The devices in the example device lattice 300 shown in FIG. 3 can be used to execute quantum error-correction schemes. The quantum error-correction scheme may use ancilla qubits in the device lattice 300 to detect and correct errors on data qubits in the device lattice 300. In some examples, a two-dimensional color code or two-dimensional surface code can be applied in the example device lattice 300.

In FIG. 3, four data qubits 314A, 314B, 314C and 314D are defined by the respective transmon devices T1, T2, T3 and T4, and four ancilla qubits 312A, 312B, 312C and 312D are defined by the respective fluxonium devices F1, F2, F3 and F4. As shown in FIG. 3, ancilla qubits 312A, 312B, 312C and 312D reside on the edges of the square lattice cell and data qubits 314A, 314B, 314C and 314D reside at the vertices. In this example, the device lattice 300 can be mapped to a two-dimensional color code lattice with the data qubits 314A, 314B, 314C and 314D at vertices of the color code lattice and the ancilla qubits 312A, 312B, 312C and 312D on faces of the color code lattice. The stabilizers of the two-dimensional color code can be implemented as parity measurements on faces of the color code lattice.

In some instances, parity measurements for the quantum error-correction scheme can be implemented using controlled-not (CNOT) gates applied to neighboring pairs of the devices in the device lattice 300. A CNOT gate can be applied to two qubits, referred to as a control qubit and a target qubit, and performs the following logical operations on the pair of qubits:

$U_{CNOT}|00\rangle \rightarrow |00\rangle$
$U_{CNOT}|01\rangle \rightarrow |01\rangle$
$U_{CNOT}|10\rangle \rightarrow |11\rangle$
$U_{CNOT}|11\rangle \rightarrow |10\rangle$ The action of the CNOT is to flip the state of the target qubit conditional on the state of the control qubit. A CNOT gate forms a universal set of quantum gates when it is used with single qubit gates. The CNOT gates applied in the device lattice 300 may be implemented as described with respect to one or more of FIGS. 4, 5, 8 and 9, or the CNOT gates may be performed in another manner.

An example technique for extracting a Z-parity measurement of the data qubits 314A, 314B, 314C and 314D defined by transmon devices T1, T2, T3, and T4 is to perform the following steps. First, apply a first set of two-qubit gates. In some examples, the first set of two-qubit gates includes a CNOT gate with the first data qubit 314A as the control and the first ancilla qubit 312A as the target (CNOT T1 and F1); a CNOT gate with the second data qubit 314B as the control and the second ancilla qubit 312B as the target (CNOT T2 and F2); a CNOT gate with the third data qubit 314A as the control and the third ancilla qubit 312A as the target (CNOT T3 and F3); and a CNOT gate with the fourth data qubit 314D as the control and the fourth ancilla qubit 312D as the target (CNOT T4 and F4). Second, apply a second, different set of two-qubit gates. In some examples, the second set of two-qubit gates includes a CNOT gate with the first data qubit 314A as the control and the fourth ancilla qubit 312D as the target (CNOT T1 and F4); a CNOT gate with the second data qubit 314B as the control and the first ancilla qubit 312A as the target (CNOT T2 and F1); a CNOT gate with the third data qubit 314A as the control and the second ancilla qubit 312B as the target (CNOT T3 and F2); and a CNOT gate with the fourth data qubit 314D as the control and the third ancilla qubit 312C as the target (CNOT T4 and F3). Third, obtain measurement outcomes of the ancilla qubits. In some examples, the measurement outcomes are obtained by measuring the fluxonium devices in the Z-basis. For example, projective measurements applied to the fluxonium devices (e.g., in the Z-basis or another basis) may produce binary a set of measurement outcomes (e.g., a "0" or "1" from each qubit measured). Finally, compute the overall parity of the measurement outcomes (e.g., the parity of the Z-basis measurements).

In the example outlined in the preceding paragraph, the two-qubit gates in the first set and the two-qubit gates in the second set are applied to respective pairs of qubits in the lattice cell, and each respective pair includes one of the data qubits and one of the ancilla qubits; moreover, each of the two-qubit gates in the first set and each of the two-qubit gates in the second set is applied to a distinct pair of the qubits in the lattice cell. In some cases, other combinations of gates can achieve a similar effect and can also be used to implement X-parity measurements on a lattice cell.

Figure 4:
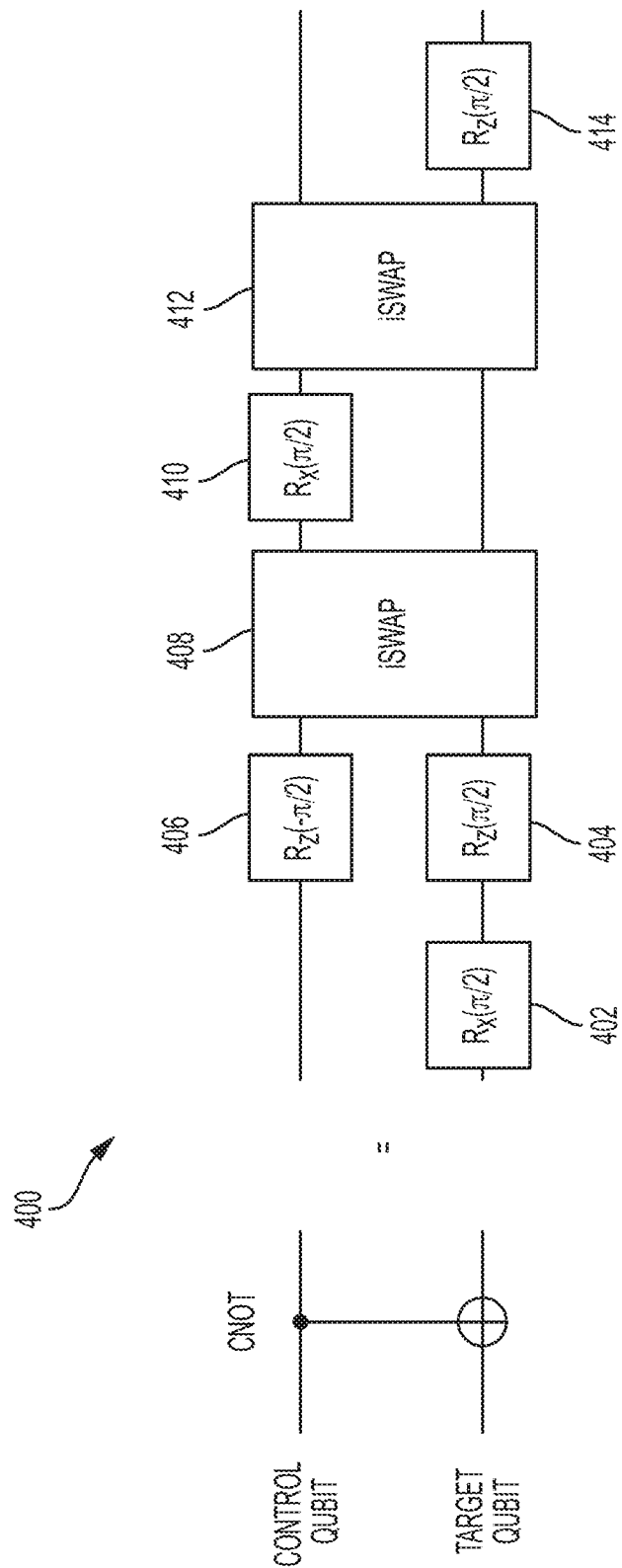
FIG. 4 is a diagram of an example quantum logic circuit.

FIG. 4 is a diagram of an example quantum logic circuit 400, which can be used to perform a CNOT gate. The example quantum logic circuit 400 includes quantum logic gates applied to a control qubit and a target qubit. The example quantum logic gates shown in FIG. 4 include single-qubit gates and two-qubit iSWAP gates. A CNOT gate can be performed in another manner. For example, in some cases, a CNOT gate can be implemented using a sequence of single qubit gates along with a controlled-phase gate (e.g., when the two qubits have a ZZ-coupling).

As shown in FIG. 4, a π/2 x-rotation 402 and a π/2 z-rotation 404 are applied to the target qubit, and a −π/2 z-rotation 406 is applied to the control qubit. Next, a first iSWAP gate 408 is applied to the target and control qubits, followed by a π/2 x-rotation 410 applied to the control qubit. Finally, a second iSWAP gate 412 is applied to the target and control qubits, followed by a π/2 z-rotation 414 applied to the target qubit. This sequence of gates can produce the unitary operation $$U'_{CNOT} = \left[I^{(1)} \otimes R_z^{(2)}\left(\frac{\pi}{2}\right)\right]$$
$$U_{iSWAP}\left[R_x^{(1)}\left(\frac{\pi}{2}\right) \otimes I^{(2)}\right]\left[R_z^{(2)}\left(-\frac{\pi}{2}\right) \otimes R_Z^{(1)}\left(\frac{\pi}{2}\right)\right]\cdots\left[I^{(1)} \otimes R_x^{(2)}\left(\frac{\pi}{2}\right)\right],$$

where the iSWAP gate is represented by the unitary operator $$U_{iSWAP} = \begin{pmatrix} 1 & 0 & 0 & 0 \\ 0 & 0 & i & 0 \\ 0 & i & 0 & 0 \\ 0 & 0 & 0 & 1 \end{pmatrix}.$$

This operation yields a CNOT gate up to an unimportant overall phase factor $$U'_{CNOT} = e^{-i\pi/4} U_{CNOT} = e^{-i\pi/4} \begin{pmatrix} 1 & 0 & 0 & 0 \\ 0 & 1 & 0 & 0 \\ 0 & 0 & 0 & 1 \\ 0 & 0 & 1 & 0 \end{pmatrix}.$$

In some cases, the example quantum logic circuit 400 shown in FIG. 4 can be used to apply a CNOT gate to qubits defined by a transmon device and a fluxonium device. For example, the quantum logic circuit 400 shown in FIG. 4 may be applied to neighboring pairs of devices in the example device lattice 300 shown in FIG. 3. For instance, the quantum logic circuit 400 shown in FIG. 4 may be applied to the transmon device T1 and the fluxonium device F1, where the data qubit 314A is the control and the ancilla qubit 312A is the target. In some implementations, performing the CNOT gate includes biasing the fluxonium device to the resonant frequency of the transmon device, for instance, as shown in FIG. 5 or in another manner.

FIG. 5 is a diagram of an example control sequence 500 configured to apply a CNOT gate. The example control sequence 500 includes pulses 502, 504, 514 applied to a fluxoinum device that defines the target qubit; pulses 506, 510 applied to a transmon device that defines the control qubit, and tuning pulses 508, 512 applied to the fluxonium device. A control sequence for applying a CNOT gate may include additional or different pulses and other features.

In some cases, the control sequence 500 shown in FIG. 5 can be used to implement a CNOT gate according to the quantum logic circuit 400 shown in FIG. 4, where the target qubit is defined by a fluxonium device and the control qubit is defined by a transmon device having an operating frequency that is lower than the parking frequency of the fluxonium device. In FIG. 5, the operating frequency $\omega_1$ is the $|0\rangle \to |1\rangle$ transition frequency of the transmon device, which is lower than a park frequency of the fluxonium device. In this example, applying the CNOT gate includes sending the tuning pulses 508, 512 to the fluxonium device, and each tuning pulse tunes the operating frequency $\omega_2(t)$ of the fluxonium device down to the operating frequency $\omega_1$ of the transmon device.

The pulses 502, 504, 506, 510 and 514 can be microwave pulses applied to the respective transmon and fluxonium devices and configured to perform single-qubit rotations (e.g., the single-qubit rotations shown in FIG. 4). For instance, the pulse 502 in FIG. 5 can be a microwave pulse configured to perform the π/2 x-rotation 402 in FIG. 4; the pulse 504 in FIG. 5 can be a microwave pulse configured to perform the π/2 z-rotation 404 in FIG. 4; the pulse 506 in FIG. 5 can be a microwave pulse configured to perform the −π/2 z-rotation 406 in FIG. 4; and the pulse 510 in FIG. 5 can be a microwave pulse configured to perform the π/2 x-rotation 410 in FIG. 4.

In the example shown in FIG. 5, the control sequence 500 performs a CNOT gate in a total gate time that is the sum of individual pulse times. Thus, the total gate time for the example CNOT gate can be calculated by adding the pulse times shown in FIG. 5:

$$t_{CNOT} = t_1 + t_2 + t_3 + 2t_s.$$

The tuning pulses 508, 512 can be DC bias pulses applied to the fluxonium device and configured to perform two-qubit operations (e.g., the iSWAP gates shown in FIG. 4). For instance, the tuning pulse 508 can be a DC bias pulse configured to perform the iSWAP gate 408 in FIG. 4; and the tuning pulse 512 can be a DC bias pulse configured to perform the iSWAP gate 412 in FIG. 4. The tuning pulses 508, 512 can be configured to perform an iSWAP gate between qubits defined on a transmon device and a fluxonium device by a transverse-type qubit-qubit coupling $$H = \omega_1 \sigma_{1z}/2 + \omega_2(t)\sigma_{2z}/2 + g_{12}(\sigma_1\sigma_2^\dagger + \sigma_1^\dagger\sigma_2) \qquad (1)$$

where $\omega_1$ represents the operating frequency of transmon device (which remains constant during the control sequence 500), $\omega_2(t)$ represents the operating frequency of fluxonium device (which varies in response to tuning pulses in the control sequence 500), and $g_{12}$ represents the transmon-fluxonium coupling strength. The operating frequency of the fluxonium device can be tuned to control the quantum interaction between the two qubits.

In the example shown in FIG. 5, the two qubits are initially detuned so that there is no interaction, or only a negligible (weak) interaction, between them. During the time period $t_1$, while the two qubits remain detuned, pulses 502, 504, 506 are applied to perform single-qubit rotations on the respective qubits. The tuning pulse 508 tunes the operating frequency of the fluxonium device towards the frequency of the transmon device, to achieve a resonant coupling that can be described as $H_{int} = g_{12}(\sigma_1\sigma_2^\dagger + \sigma_1^\dagger\sigma_2)$. This qubit-qubit interaction can give rise to an iSWAP operation after the interaction time $t_s = \pi/2g_{12}$ $$U_{iSWAP} = \exp[-iH_{int}t_s] = \exp\left[-\frac{iH_{int}\pi}{2g_{12}}\right] = \begin{pmatrix} 1 & 0 & 0 & 0 \\ 0 & 0 & i & 0 \\ 0 & i & 0 & 0 \\ 0 & 0 & 0 & 1 \end{pmatrix}$$

In this example, the total gate time will be the iSWAP time plus the ramp up and down time: $t_{iSWAP} = i_s + t_{ramp}$. In general, for an arbitrary iSWAP exponent gate, the gate time can be written as $$t_{n\sqrt{iSWAP}} = \frac{2\pi}{2ng_{12}} + t_{ramp}$$

where n=1, 2, 4, . . . . In some cases, the operating frequency of the fluxonium device is slowly (e.g., adiabatically) tuned toward the transition frequency of the transmon device, such that there is finite detuning between them during the interaction period. In some cases, the operating frequency of the fluxonium device is quickly (e.g., non-adiabatically) tuned toward and to the transition frequency of the transmon device, such that there is no detuning between them during the interaction period.

Figure 10:
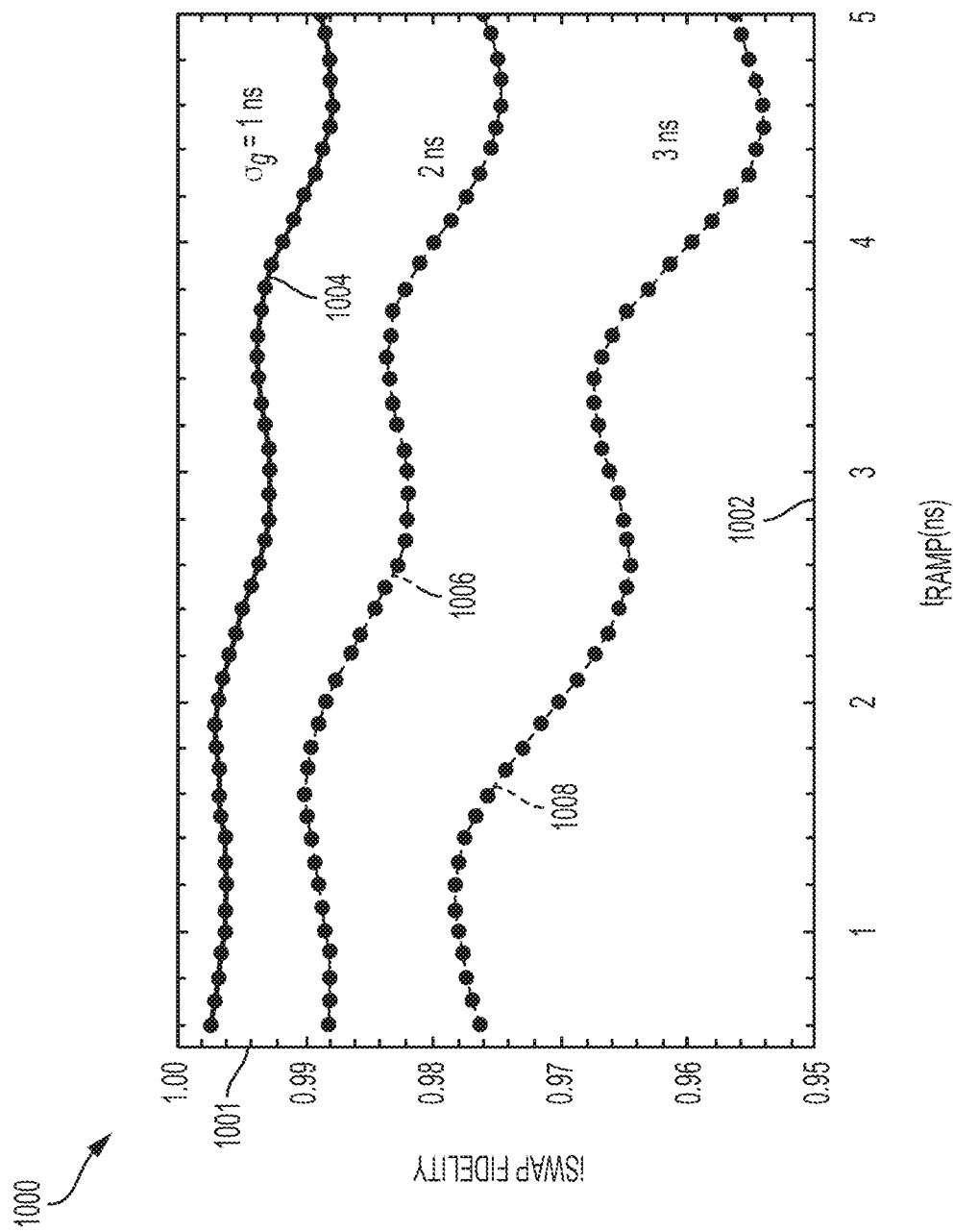
FIG. 10 is a plot showing example gate fidelities for an iSWAP gate.

FIG. 10 is a plot 1000 showing example gate fidelities for iSWAP gates, based on numerical simulations. In this example, we consider a transmon device with frequency $\omega_1/2\pi = 4.1$ GHz, coupling strength $g/2\pi = 2.5$ MHz, a fluxonium device with parking frequency $\omega_p/2\pi = 4.7$ GHz with a tuning pulse shape $$\omega_{01}^F(t) = \omega_p + \frac{\omega_1 - \omega_p}{2}\left[\text{Erf}\left(\frac{t - t_{ramp}}{\sqrt{2}\sigma_g}\right) - \text{Erf}\left(\frac{t - t_s}{\sqrt{2}\sigma_g}\right)\right]$$

where the variable $\sigma_g$ is proportional to the slope of the ramp up and down part of the pulse. In the plot 1000 shown in FIG. 10, the vertical axis 1001 represents a range of gate fidelity for the iSWAP gates, and the horizontal axis 1002 represents a range of values for the ramp time $t_{ramp}$ in units of nanoseconds (ns).

The plot 1000 includes three curves 1004, 1006, 1008 based on data from numerical simulations performed on a classical computer, for different values of the variable $\sigma_g$. In particular, the curves 1004, 1006, 1008 in FIG. 10 correspond to $\sigma_g = 1$ ns, 2 ns, and 3 ns, respectively. In the example shown, at $t_{ramp} = 2$ ns and $\sigma_g = 1$ ns, the iSWAP gate fidelity is 99.69% with a total gate time $t_{iSWAP} = 102$ ns. The numerical simulations used to generate the data shown in FIG. 10 assumed a decoherence time $T_1 = 10$ μs for both qubits. In this example, the fidelity is limited based on how fast the pulse ramps up or down. When the operating frequency of the fluxonium device approaches the transmon frequency faster (i.e., smaller $\sigma_g$), the fidelity generally increases; when the operating frequency of the fluxonium device approaches the transmon frequency slower (i.e., larger $\sigma_g$), the fidelity generally decreases.

In some cases, another control sequence can be used to perform a CNOT gate, where the target qubit is defined by a fluxonium device and the control qubit is defined by a transmon device having an operating frequency that is higher than the parking frequency of the fluxonium device. In such cases, the CNOT gate may be performed without iSWAP gates, for instance, because of weak anharmonicity of the transmon device and leakage to the second excited state $|2\rangle$ of the transmon device. Instead, a controlled-z gate (CZ gate) and Hadamard gates can be used to generate a CNOT gate between the fluxonium device and the higher-frequency transmon device.

FIG. 6A is an energy level diagram 600A showing example energy levels of a transmon device and a fluxonium device. FIG. 6A shows three energy levels of the transmon device: the ground state $|0\rangle$, the first excited state $|1\rangle$ and the second excited state $|2\rangle$. FIG. 6A also shows two transitions in the transmon device: the $|0\rangle \rightarrow |1\rangle$ transition 602 having a transition frequency $\omega_{01}^T$, and the $|1\rangle \rightarrow |2\rangle$ transition 604 having a transition frequency $\omega_{12}^T$. FIG. 6A also shows three energy levels of the fluxonium device: the ground state $|0\rangle$, the first excited state $|1\rangle$ and the second excited state $|2\rangle$. FIG. 6A also shows two transition in the fluxonium device: the $|0\rangle \rightarrow |1\rangle$ transition 606 having a transition frequency $\omega_{01}^F(t)$, and the $|1\rangle \rightarrow |2\rangle$ transition 608 having a transition frequency $\omega_{12}^F(t)$. The energy levels and transition frequencies of the fluxonium device are shown as time-dependent values in FIG. 6A because they can be varied over time, for instance, by application of a tuning pulse to the fluxonium device. The energy levels and transition frequencies of the transmon device are not shown as time-dependent values in FIG. 6A.

In this example, the ground state $|0\rangle$ and first excited state $|1\rangle$ of each device defines a respective qubit. As shown, the operating frequency $\omega_{01}^T$ of the transmon device is higher than the parking frequency of the fluxonium device. FIG. 6B is a diagram of an example control sequence 600B for performing a CZ gate in a system having the energy level diagram 600A shown in FIG. 6B. The CZ gate can be expressed as the following unitary matrix $$U_{CZ} = \begin{pmatrix} 1 & 0 & 0 & 0 \\ 0 & 1 & 0 & 0 \\ 0 & 0 & 1 & 0 \\ 0 & 0 & 0 & -1 \end{pmatrix},$$

which produces the logical operation that it changes the two-qubit state $|11\rangle \rightarrow -|11\rangle$ and all other three states remain the same. The CZ gate can be applied between qubits defined by a fluxonium device and a higher-frequency transmon device. This includes level $|2\rangle$ of the transmon device. The Hamiltonian of the system, considering, for example, three energy levels of the transmon device and fluxonium device has the form $$H = \begin{pmatrix} 0 & 0 & 0 \\ 0 & \omega_{01}^T & 0 \\ 0 & 0 & \omega_{01}^T + \omega_{12}^T \end{pmatrix} \otimes I^{(2)} +$$

$$\ldots I^{(1)} \otimes \begin{pmatrix} 0 & 0 & 0 \\ 0 & \omega_{01}^F(t) & 0 \\ 0 & 0 & \omega_{01}^F(t) + \omega_{12}^F(t) \end{pmatrix} + g(\sigma_1\sigma_2^\dagger + \sigma_1^\dagger\sigma_2),$$

where $\omega_{01}^T$ and $\omega_{12}^T = \omega_{01}^T - \eta^T$ are the frequencies associated with the $|0\rangle \rightarrow |1\rangle$ and $|1\rangle \rightarrow |2\rangle$ transitions of the transmon device, with $\eta^T$ being the anharmonicity of the transmon device; $\omega_{01}^F$ and $\omega_{12}^F$ are frequencies associated with the $|0\rangle \rightarrow |1\rangle$ and $|1\rangle \rightarrow |2\rangle$ transitions of fluxonium device; g is the fluxonium-transmon coupling strength and $$\sigma_1 = \begin{pmatrix} 0 & 1 & 0 \\ 0 & 0 & \sqrt{2} \\ 0 & 0 & 0 \end{pmatrix} \otimes I^{(2)}, \quad \sigma_2 = I^{(1)} \otimes \begin{pmatrix} 0 & 1 & 0 \\ 0 & 0 & \sqrt{2} \\ 0 & 0 & 0 \end{pmatrix}$$

$\sigma_j^+ = (\sigma_j)^\dagger$ and I is the identity operator.

In the example shown in FIG. 6B, a tuning pulse 628 tunes the fluxonium device to produce a quantum interaction between the transmon device and fluxonium device, and the quantum interaction over the time period of the tuning pulse 628 applies the CZ gate to qubits defined by the transmon device and fluxonium device. The tuning pulse 628 tunes the fluxonium device from its park frequency to the $|1\rangle \rightarrow |2\rangle$ transition frequency $\omega_{12}^T$ of the transmon device, and after an interaction time determined by the length of the tuning pulse (which may be set based on the coupling strength), the tuning pulse 628 tunes the fluxonium device back to the parking frequency as shown in FIG. 6B. During the interaction time, the states of the two qubits hybridize and the resulting states repel each other giving rise to phase shifts. The plot 700A in FIG. 7A shows an example of energy levels of eigenstates that repel each other when a fluxonium device is tuned to a transition frequency of a transmon device.

Figure 7A:
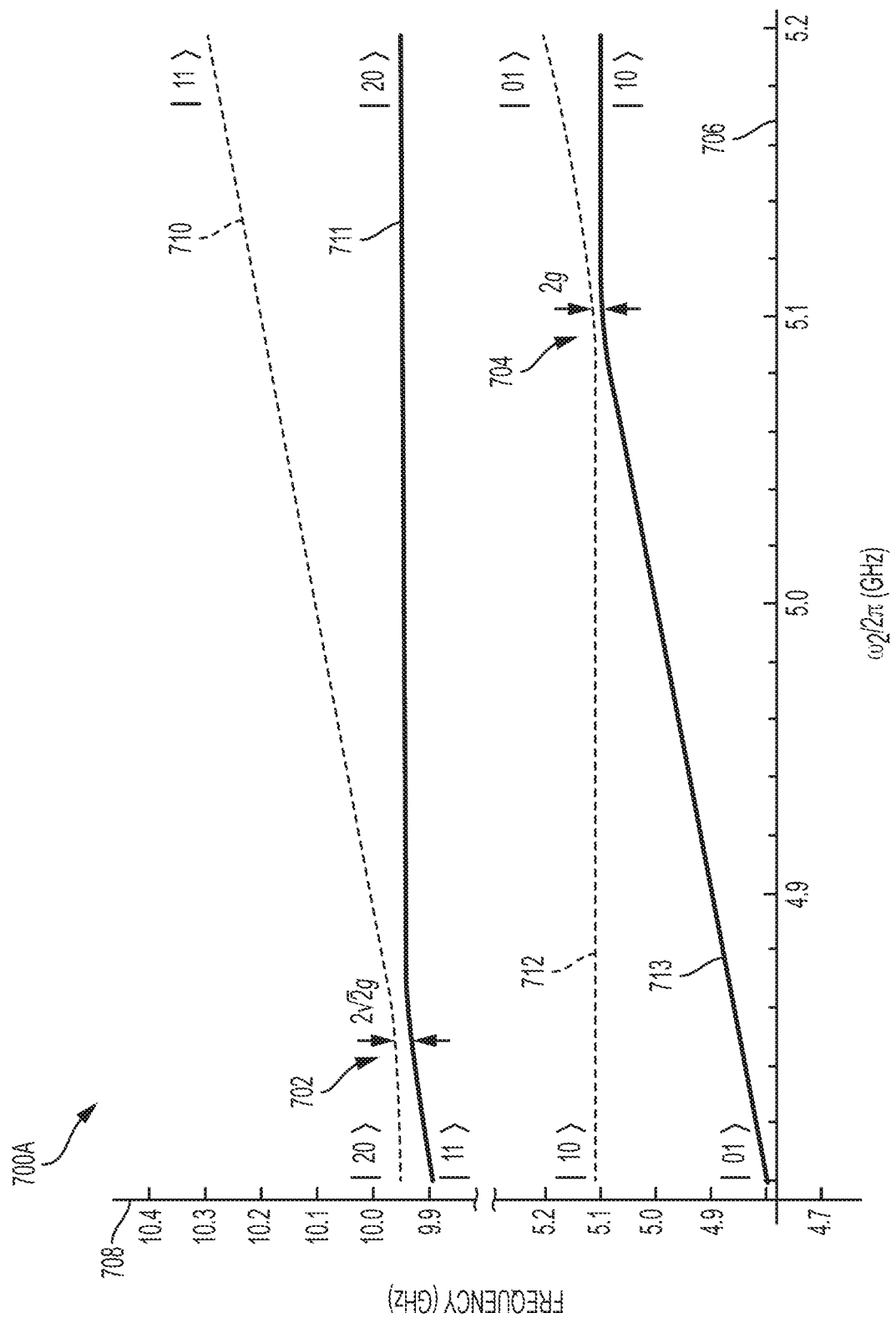
FIG. 7A is a plot showing example eigenfrequencies of devices in a quantum computing system.

FIG. 7A is a plot 700A showing example eigenfrequencies of devices in a quantum computing system. The plot 700A demonstrates an example of energy level repulsion of eigenstates in a system that includes a transmon device coupled to a fluxonium device. The horizontal axis 706 represents a range of operating frequencies for the fluxonium device in units of GigaHertz (GHz). The vertical axis 708A represents a range of eigenfrequencies for each eigenstate in units in units of GigaHertz (GHz). The curves 710, 711, 712, 713 represent the eigenfrequencies of the eigenstates $|11\rangle$, $|20\rangle$, $|01\rangle$, $|10\rangle$. Here, each ket represents a composite state of the transmon device and fluxonium device; the first digit in each ket represents the energy level of the transmon device in the composite state, and the second digit in each ket represents the energy level of the fluxonium device in the composite state.

As indicated at 702 in FIG. 7A, the energy levels of the eigenstates $|11\rangle$ and $|20\rangle$ repel each other. For instance, when the operating frequency of the fluxonium device $\omega_{01}^F(t)$ is tuned towards $\omega_{12}^T$ as shown in FIG. 6B, the energy levels of the eigenstates $|11\rangle$ and $|20\rangle$ repel each other, which results in a phase shift in both eigenstates $|11\rangle$ and $|20\rangle$. Since the logical gate is defined in the basis $\{|00\rangle, |01\rangle, |10\rangle, |11\rangle\}$, the phase shift acquired by the eigenstate $|20\rangle$ does not affect the gate fidelity.

As indicated at 704 in FIG. 7A, the energy levels of the eigenstates $|10\rangle$ and $|01\rangle$ also repel each other, which can create a phase shift, in response to tuning the operating frequency of the fluxonium device. This effect is usually small because, as shown in the plot 700A, the repulsion between the eigenstates $|10\rangle$ and $|01\rangle$ occurs at a frequency that is far from the frequency ($\omega_{12}^T$) at which the repulsion between the eigenstates $|11\rangle$ and $|20\rangle$ occurs. In this example, the difference between the two frequencies at which the repulsions occur is the transmon anharmonicity $\eta^T$. In some instances, higher transmon anharmonicity allows less leakage to these levels, which can produce better gate fidelity.

In principle, repulsion between the eigenstates $|11\rangle$ and $|02\rangle$ can affect the phase shift acquired by the eigenstate $|11\rangle$, and thus the gate fidelity, depending on the value of the frequency $\omega_{12}^F$ of the fluxonium device. When the fluxonium device has strong anharmonicity, the repulsion of $|11\rangle$ and $|02\rangle$ occurs a few GHz away from where the repulsion between $|11\rangle$ and $|20\rangle$ occurs. The phase-shift acquired by the $|11\rangle$ state is given by $$\phi = \int_0^{t_{CZ}} \sqrt{2} g \, dt = \sqrt{2} g \, t_{CZ}.$$

To create the CZ gate, the phase shift should be $\pi$, implying that the gate time should be $$t_{CZ} = \pi / \sqrt{2} g.$$

Figure 7B:
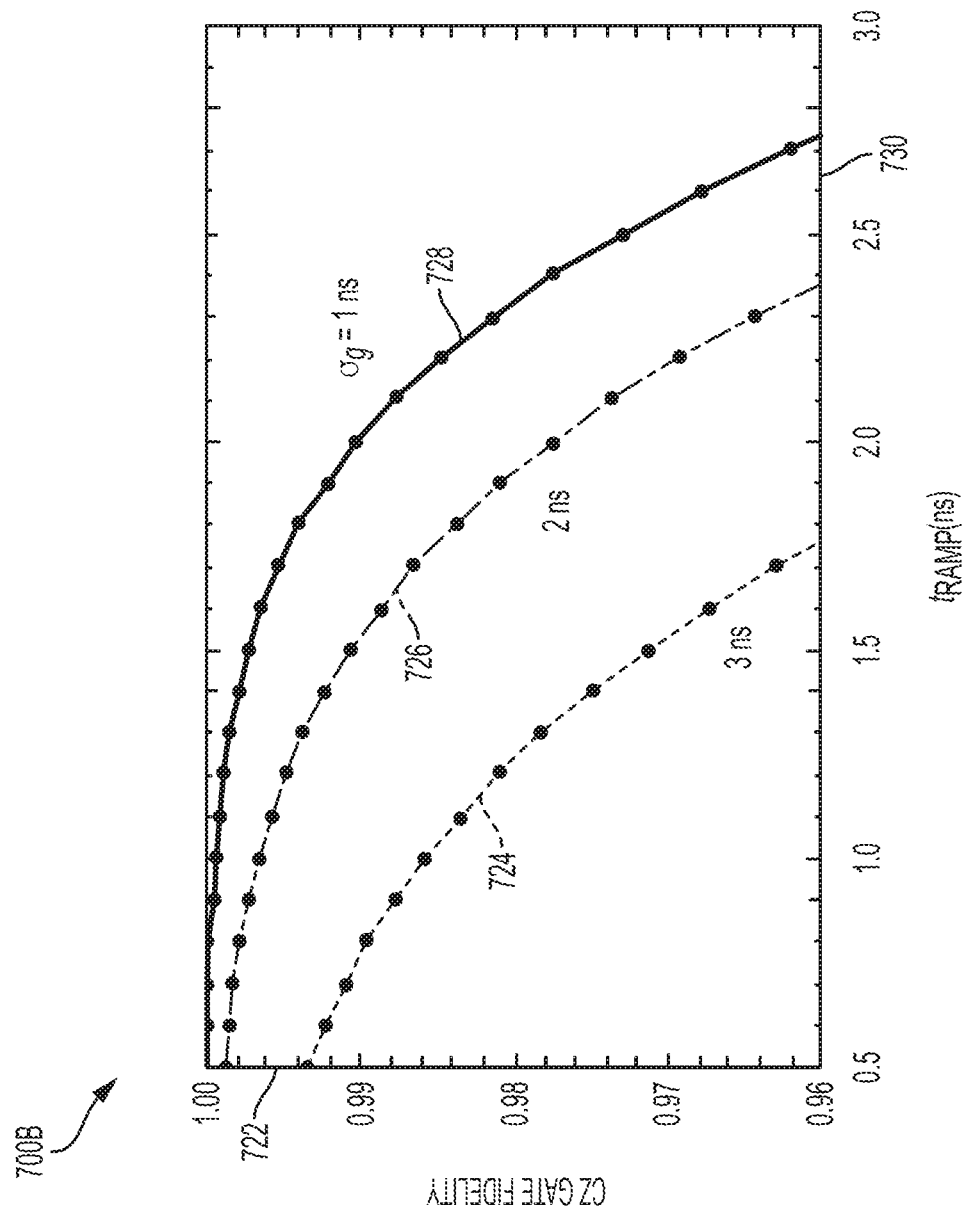
FIG. 7B is a plot showing example gate fidelities for a controlled-z gate.

FIG. 7B is a plot 700B showing example gate fidelities for controlled-z (CZ) gates. In this example, a tuning pulse applied to the fluxonium device is used to perform the CZ gate. The tuning pulse tunes the operating frequency of the fluxonium device as $$\omega_{01}^F(t) = \omega_p + \frac{\omega_{12}^T - \omega_p}{2}\left[\mathrm{Erf}\left(\frac{t - t_{ramp}}{\sqrt{2}\,\sigma_g}\right) - \mathrm{Erf}\left(\frac{t - t_{CZ}}{\sqrt{2}\,\sigma_g}\right)\right].$$

Here, $\omega_p$ represents the parking frequency of the fluxonium device, $\omega_{12}^T$ represents the frequency of the $|1\rangle \rightarrow |2\rangle$ transition of the transmon device, $t_{ramp}$ represents the ramp time of the pulse, $\sigma_g$ represents the width of the tuning pulse and $t_{CZ}$ represents the time of the controlled-z gate. In some cases, the fluxonium device can be implemented as any type of tunable qubit device, and the transmon device can be implemented as any type of fixed-frequency qubit device. The data shown in FIG. 7B were obtained by numerical simulations using the following parameter values in Table I.

TABLE 1

| Example parameter values | |
| --- | --- |
| Parameter | Value |
| $\omega_{01}^T/2\pi$ | 5.1 GHz |
| $\omega_p/2\pi$ | 4.7 GHz |
| $\eta^T/2\pi$ | 250 MHz |
| $g/2\pi$ | 5 MHz |

In the plot 700B shown in FIG. 7B, the vertical axis 722 represents a range of values for the gate fidelity of the CZ gates, and the horizontal axis 730 represents a range of values for the ramp time $t_{ramp}$ in units of nanoseconds (ns). The plot 700B includes three curves 724, 726, 728 based on data from numerical simulations performed on a classical computer, for different values of the variable $\sigma_g$. In particular, the curves 724, 726, 728 in FIG. 7B correspond to $\sigma_g = 3$ ns, 2 ns, and 1 ns, respectively.

Figure 8:
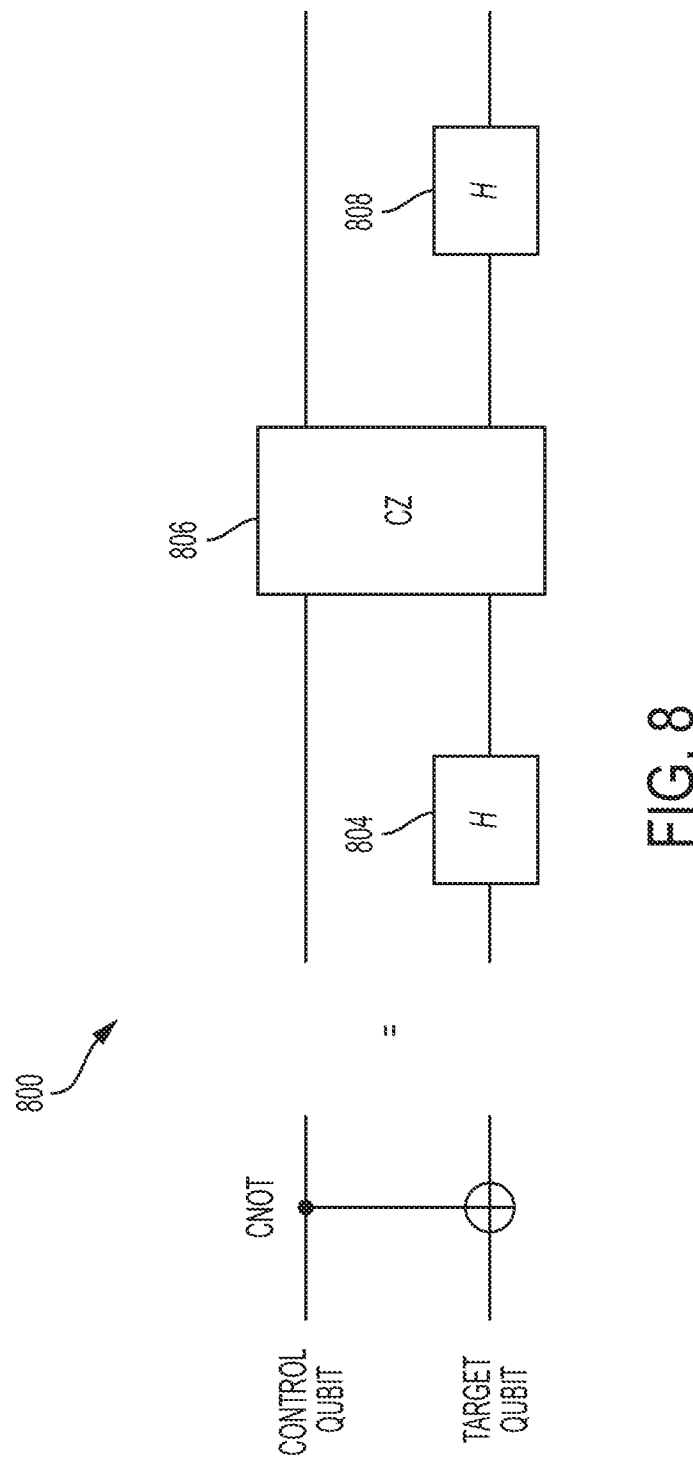
FIG. 8 is a diagram of an example quantum logic circuit.

FIG. 8 is a diagram of an example quantum logic circuit 800, which can be used to perform a CNOT gate. The example quantum logic circuit 800 includes quantum logic gates applied to a control qubit and a target qubit. The example quantum logic gates shown in FIG. 8 include single-qubit Hadamard gates and a two-qubit CZ gate. A CNOT gate can be performed in another manner. As shown in FIG. 8, a first Hadamard gate 804 is applied to the target qubit, a CZ gate 806 is applied to the target and control qubits, and a second Hadamard gate 808 is applied to the target qubit.

In some cases, the example quantum logic circuit 800 shown in FIG. 8 can be used to apply a CNOT gate to qubits defined by a transmon device and a fluxonium device. The quantum logic circuit 800 shown in FIG. 8 may be used, for instance, in a system having the properties shown in FIG. 6A, where the fluxonium device defines the target qubit and a higher-frequency transmon device defines the control qubit. In some instances, the quantum logic circuit 800 shown in FIG. 8 is applied to neighboring pairs of devices in the example device lattice 300 shown in FIG. 3. For instance, the quantum logic circuit 800 shown in FIG. 8 may be applied to the transmon device T1 and the fluxonium device F1, where the data qubit 314A is the control and the ancilla qubit 312A is the target. In some implementations, performing the CNOT gate includes biasing the fluxonium device to the resonant frequency of the transmon device, for instance, as shown in FIG. 9 or in another manner.

FIG. 9 is a diagram of an example control sequence 900 that can be used to perform a CNOT gate. The example control sequence 900 includes sets of pulses 904, 908 applied to a fluxoinum device that defines the target qubit, and a tuning pulse 906 applied to the fluxonium device. A control sequence for applying a CNOT gate may include additional or different pulses and other features.

In some cases, the control sequence 900 shown in FIG. 9 can be used to implement a CNOT gate according to the quantum logic circuit 800 shown in FIG. 8, where the target qubit is defined by a fluxonium device and the control qubit is defined by a transmon device having an operating frequency that is higher than the parking frequency of the fluxonium device. In FIG. 9, the operating frequency $\omega_{01}^T$ (which is the $|0\rangle \rightarrow |1\rangle$ transition frequency of the transmon device) and the transition frequency $\omega_{12}^T$ (which is the $|1\rangle \rightarrow |2\rangle$ transition frequency of the transmon device) are both higher than a park frequency of the fluxonium device, and applying the CNOT gate includes tuning the operating frequency $\omega_{01}^F(t)$ of the fluxonium device up to the transition frequency $\omega_{12}^T$ of the transmon device.

The sets of pulses 904, 908 applied to the fluxonium device can be microwave pulses configured to perform single-qubit gates (e.g., the single-qubit Hadamard gates shown in FIG. 8). As an example, a Hadamard gate can be generated (up to unimportant phase factor) by applying two single-qubit rotations (e.g., a $\pi$ rotation about the z-axis followed by $\pi/2$ rotation about y-axis) on the target qubit, producing the unitary operator $$U_H = R_X\left(\frac{\pi}{2}\right) R_Z(\pi) = e^{\frac{i\pi}{2}} \frac{1}{\sqrt{2}} \begin{pmatrix} 1 & 1 \\ 1 & -1 \end{pmatrix}.$$

In this manner, the set of pulses 904 in FIG. 9 can be two microwave pulses configured to perform the Hadamard gate 804 in FIG. 8; and the set of pulses 908 in FIG. 9 can be two microwave pulses configured to perform the Hadamard gate 808 in FIG. 8. The tuning pulse 906 can be DC bias pulses applied to the fluxonium device and configured to perform the two-qubit gate (e.g., the CZ gate 806 shown in FIG. 8). In the example shown in FIG. 9, the control sequence 900 performs a CNOT gate in a total gate time that is the sum of individual pulse times. Thus, the total gate time for the example CNOT gate can be calculated by adding the pulse times shown in FIG. 9:

$t_{CNOT} = t_{CZ} + 2t_H.$

As shown in FIG. 9, the operating frequency $\omega_{01}^F(t)$ of the fluxonium device begins at the parking frequency, then the tuning pulse 906 tunes the operating frequency $\omega_{01}^F(t)$ to the transition frequency $\omega_{12}^T$ (the frequency of the $|1\rangle \rightarrow |2\rangle$ transition) of the transmon device, and then the tuning pulse 906 tunes the operating frequency $\omega_{01}^F(t)$ back to the parking frequency once the specified phase shift is acquired by the $|11\rangle$ state. Because the operating frequency of the transmon device $\omega_{01}^T$ remains far from the operating frequency of the fluxonium device $\omega_{01}^F(t)$, the phase shift applied to the basis states $|10\rangle$ and $|01\rangle$ can be minimal.

In a general aspect of the subject matter described above, quantum error-correction is applied in microwave integrated quantum circuits.

In a first example, a first set of two-qubit gates is applied to qubits in a lattice cell. The qubits in the lattice cell include data qubits and ancilla qubits. The ancilla qubits in the lattice cell reside between respective nearest-neighbor pairs of the data qubits in the lattice cell. A second, different set of two-qubit gates is applied to the qubits in the lattice cell. After applying the first and second sets of two-qubit gates, measurement outcomes of the ancilla qubits in the lattice cell are obtained, and a parity of the measurement outcomes is determined.

In a second example, a quantum computing includes a quantum processor cell and a control system. The quantum processor cell includes a device lattice. The control system is communicably coupled to the quantum processor cell to control the device lattice. The control system is configured to perform one or more operations of the first example.

Implementations of the first or second example may include one or more of the following features. An error in one or more of the data qubits can be detected based on the parity of the measurement outcomes. The error detected in one or more of the data qubits can be corrected.

Implementations of the first or second example may include one or more of the following features. The two-qubit gates in the first set and the two qubit gates in the second set can be applied to respective pairs of qubits in the lattice cell and each respective pair can include one of the data qubits and one of the ancilla qubits. Each of the two-qubit gates in the first set and each of the two-qubit gates in the second set can be applied to a distinct pair of the qubits in the lattice cell.

Implementations of the first or second example may include one or more of the following features. The first set of two-qubit gates can be a first set of controlled-not gates and the second set of two-qubit gates can be a different set of controlled-not gates. The controlled-not gates in the first set and the controlled-not gates in the second set can be applied to respective pairs of devices in the lattice cell, with one of the data qubits as the control and one of the ancilla qubits as the target.

Implementations of the first or second example may include one or more of the following features. The first set of controlled-not gates can include a controlled-not gate with a first data qubit as the control and a first ancilla qubit as the target; a controlled-not gate with a second data qubit as the control and a second ancilla qubit as the target; a controlled-not gate with a third data qubit as the control and a third ancilla qubit as the target; and a controlled-not gate with a fourth data qubit as the control and a fourth ancilla qubit as the target. The second set of controlled-not gates can include a controlled-not gate with the first data qubit as the control and the fourth ancilla qubit as the target; a controlled-not gate with the second data qubit as the control and the first ancilla qubit as the target; a controlled-not gate with the third data qubit as the control and the second ancilla qubit as the target; and a controlled-not gate with the fourth data qubit as the control and the third ancilla qubit as the target.

Implementations of the first or second example may include one or more of the following features. The lattice cell can include transmon devices that define the data qubits, and fluxonium devices that define the ancilla qubits. The lattice cell can include fluxonium devices that define the data qubits, and transmon devices that define the ancilla qubits. The lattice cell can include a first group of fluxonium devices that define the data qubits, and a second group of fluxonium devices that define the ancilla qubits. The lattice cell can include a first group of transmon devices that define the data qubits, and a second group of transmon devices that define the ancilla qubits.

Implementations of the first or second example may include one or more of the following features. A square lattice includes the lattice cell, and the parity is used for quantum error-correction in a surface code or a color code applied to the square lattice.

Implementations of the first or second example may include one or more of the following features. At least one of the controlled-not gates can be applied to qubits defined respectively by a fluxonium device and a transmon device. The $|0\rangle \rightarrow |1\rangle$ transition frequency of the transmon device can be lower than a park frequency of the fluxonium device, and applying the controlled-not gate can include tuning an operating frequency of the fluxonium device down to an operating frequency of the transmon device. The $|0\rangle \rightarrow |1\rangle$ transition frequency of the transmon device can be higher than a park frequency of the fluxonium device, and applying the controlled-not gate comprises tuning an operating frequency of the fluxonium device up to resonance with the $|1\rangle \rightarrow |2\rangle$ transition frequency of the transmon device.

In another general aspect of the subject matter described above, two-qubit gates are applied to qubits defined in microwave integrated quantum circuits.

In a third example, a control system generates a control sequence configured to apply a two-qubit quantum to a first qubit and a second qubit. The first qubit is defined by a first device having a first operating frequency in a quantum processor cell, and the second qubit is defined by a second device having a second operating frequency in the quantum processor cell. The control sequence includes a tuning pulse for the first device. The control sequence is sent to the quantum processor cell, and the tuning pulse tunes the first operating frequency toward a transition frequency of the second device to produce a quantum interaction between the first device and the second device.

In a fourth example, a quantum computing system includes a quantum processor cell and a control system. The quantum processor cell includes a first device and a second device. The first device has a first operating frequency and defines a first qubit; the second device has a second operating frequency and defines a second qubit. The control system is configured to generate a control sequence to apply a two-qubit gate to the first qubit and the second qubit. The control sequence includes a tuning pulse for the first device. The control system applies the two-qubit gate by sending the control sequence to the quantum processor cell. The quantum processor cell is configured to receive the control sequence from the control system, and the tuning pulse tunes the first operating frequency toward a transition frequency of the second device to produce a quantum interaction between the first device and the second device.

Implementations of the third or fourth example may include one or more of the following features. The first device can be a fluxonium device, and the second device can be a transmon device. The two-qubit gate can be a controlled-z (CZ) gate, with the second qubit as the control and the first qubit as the target. The two-qubit gate can be a controlled-not (CNOT) gate, with the second qubit as the control and the first qubit as the target. The control sequence can further include a microwave pulse for at least one of the first device or the second device. The two-qubit gate can be an iSWAP gate. The tuning pulse can lower the first operating frequency to the second operating frequency to produce the quantum interaction. The tuning pulse can raise the first operating frequency to a transition frequency (e.g., the $|1\rangle \rightarrow |2\rangle$ transition frequency of the transmon device) other than the second operating frequency to produce the quantum interaction.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable subcombination.

A number of embodiments have been described. Nevertheless, it will be understood that various modifications can be made. Accordingly, other embodiments are within the scope of the following claims.

What is claimed is:

1. A quantum information control method for performing a two-qubit gate, the method comprising:
generating, by operation of a control system, a control sequence configured to apply a two-qubit gate to a first qubit and a second qubit, the first qubit defined by a first device having a first operating frequency in a quantum processor cell, the second qubit defined by a second device having a second operating frequency in the quantum processor cell, the control sequence comprising a tuning pulse for the first device; and
sending the control sequence comprising the tuning pulse to the quantum processor cell, wherein sending the tuning pulse to the quantum processor cell tunes the first operating frequency toward a transition frequency of the second device to produce a quantum interaction between the first device and the second device;
wherein the two-qubit gate comprises an arbitrary iSWAP exponent gate.

2. The method of claim 1, wherein the first device comprises a fluxonium device, and the second device comprises a transmon device.

3. The method of claim 1, wherein the tuning pulse lowers the first operating frequency to the second operating frequency to produce the quantum interaction.

4. The method of claim 1, wherein the tuning pulse raises the first operating frequency to a transition frequency other than the second operating frequency to produce the quantum interaction.

5. A quantum computing system comprising:
a quantum processor cell comprising a first device and a second device in a device lattice, the first device having a first operating frequency and defining a first qubit, the second device having a second operating frequency and defining a second qubit; and
a control system communicably coupled to the quantum processor cell to control the device lattice, the control system configured to:
generate a control sequence to apply a two-qubit gate to the first qubit and the second qubit, the control sequence comprising a tuning pulse; and
send the control sequence comprising the tuning pulse to the quantum processor cell, wherein sending the tuning pulse to the quantum processor cell tunes the first operating frequency toward a transition frequency of the second device to produce a quantum interaction between the first device and the second device;

wherein the two-qubit gate comprises an arbitrary iSWAP exponent gate.

6. The quantum computing system of claim 5, wherein the first device comprises a fluxonium device, and the second device comprises a transmon device.

7. The quantum computing system of claim 5, wherein sending the tuning pulse to the quantum processor cell lowers the first operating frequency to the second operating frequency to produce the quantum interaction.

8. The quantum computing system of claim 5, wherein sending the tuning pulse to the quantum processor cell raises the first operating frequency to a transition frequency other than the second operating frequency to produce the quantum interaction.

* * * * *